United States Patent
Yoshimura

(10) Patent No.: US 8,723,230 B2
(45) Date of Patent: May 13, 2014

(54) SEMICONDUCTOR DEVICE

(76) Inventor: Masaki Yoshimura, Tokyo (JP)

( * ) Notice: Subject to any disclaimer, the term of this patent is extended or adjusted under 35 U.S.C. 154(b) by 293 days.

(21) Appl. No.: 12/949,578

(22) Filed: Nov. 18, 2010

(65) Prior Publication Data

US 2011/0121367 A1     May 26, 2011

(30) Foreign Application Priority Data

Nov. 20, 2009   (JP) .................................. 2009-264911

(51) Int. Cl.
*H01L 27/08* (2006.01)

(52) U.S. Cl.
USPC ........................................................ 257/208

(58) Field of Classification Search
USPC ........................................................ 257/208
See application file for complete search history.

(56) References Cited

U.S. PATENT DOCUMENTS

| | | | |
|---|---|---|---|
| 3,995,304 A * | 11/1976 | Pease | 257/579 |
| 6,075,260 A | 6/2000 | Harayama | |
| 7,598,541 B2 | 10/2009 | Okamoto et al. | |
| 2001/0054975 A1 | 12/2001 | Katada | |
| 2005/0189595 A1 | 9/2005 | Okamoto et al. | |
| 2007/0126617 A1 | 6/2007 | Shimaya | |

FOREIGN PATENT DOCUMENTS

| | | |
|---|---|---|
| JP | 3169883 | 3/2001 |
| JP | 2000091504 A | 3/2001 |
| JP | 2002-9247 | 1/2002 |
| JP | 2003289108 A | 10/2003 |
| JP | 2005243928 A | 9/2005 |
| JP | 2007-158166 | 6/2007 |
| JP | 2007258418 A | 10/2007 |
| WO | 2008023487 A1 | 2/2008 |

OTHER PUBLICATIONS

J. Bastos et al. (1996). "Matching of MOS Transistors with Different Layout Styles," *Proceedings of the 1996 IEEE International Conference on Microelectronic Test Structures* 9: 17-18.

H. Elzinga. (1996) "On the Impact of Spatial Parametric Variations on MOS Transistor Mismatch," *Proceedings of the 1996 IEEE International Conference on Microelectronic Test Structures* 9: 173-177.

Okada, Kenichi. (2003) Thesis, Kyoto University "Research concerning Performance Analysis of Integrated Circuits," located at http://repository.kulib.kyoto-u.ac.jp/dspace/bitstream/2433/59292/1/D_Okada_Kenichi.pdf; 139 pages.

* cited by examiner

*Primary Examiner* — Matthew W Such
*Assistant Examiner* — Robert Carpenter

(57) ABSTRACT

Disclosed is a semiconductor device including transistors B on an output side of a current mirror, arranged uniformly in a surrounding area of a transistor A on an input side of the current mirror. The transistors B are arranged at equal distances, adjacently to the transistor A, on both sides of the transistor A.

10 Claims, 18 Drawing Sheets

FIG. 4A COMPARATIVE EXAMPLE
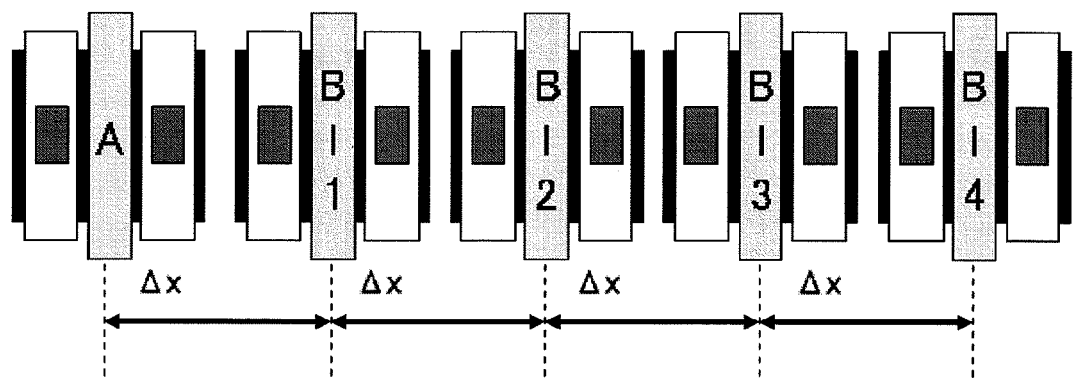
FIG. 4B COMPARATIVE EXAMPLE
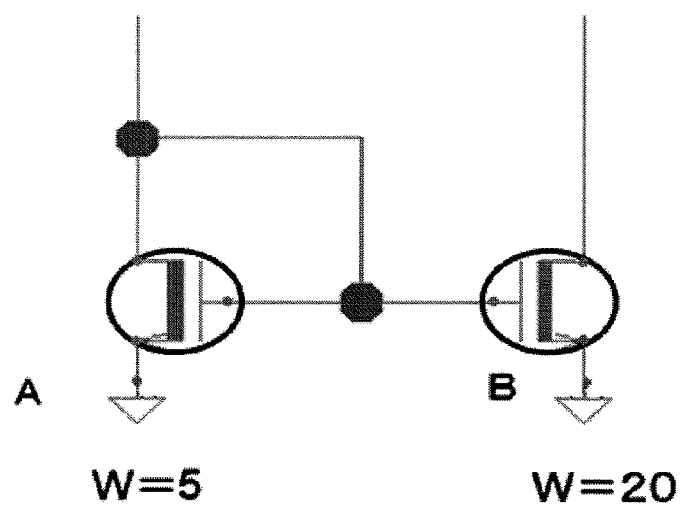

FIG. 6A
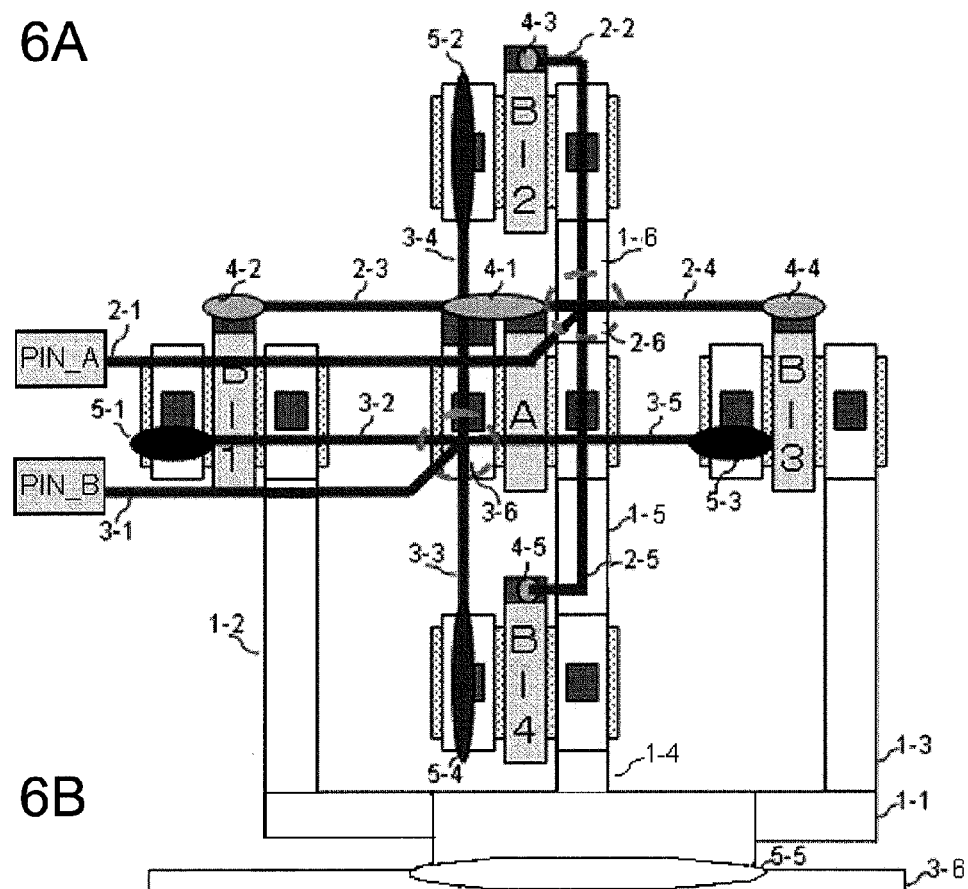
FIG. 6B
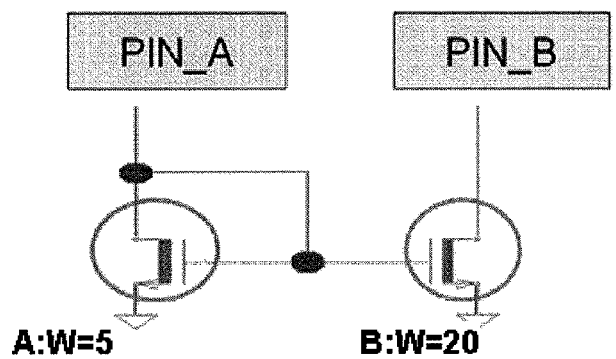

SEMICONDUCTOR DEVICE

REFERENCE TO RELATED APPLICATION

This application is based upon and claims the benefit of the priority of Japanese patent application No. 2009-264911, filed on Nov. 20, 2009, the disclosure of which is incorporated herein in its entirety by reference thereto.

TECHNICAL FIELD

The present invention relates to a semiconductor device, and in particular, to a semiconductor device provided with a preferred layout wiring structure applied to a current source or the like.

BACKGROUND

Reasons for the occurrence of variation in semiconductor devices include, for example, fabrication variation, operating environment variation, tool error, and so forth. Among these, fabrication variations include for example, shift of mask optical proximity correction (OPC), lithography misalignment, unevenness in etching and chemical mechanical polishing (CMP). Furthermore, operating environment variations include, for example, variation in power supply voltage, and temperature variation. Tool errors include, for example, error measurement by electronic design automation (EDA) tools.

Recently, with advances in semiconductor fine processing technology, effects of fabrication variation on circuit characteristics due to shrinkage in transistor dimension are becoming evident, and as a result, various types of proposals are being made with regard to layouts for reducing variations in semiconductor devices. Among these, a current source cell layout structure in which error in the current value of a current source, due to a variation in a fabrication process, is reduced by devising an arrangement layout of current source cells, and in which linearity is improved, is disclosed in, for example, Patent Document 1.

Patent Document 1 discloses a current source cell layout structure forming a constant current source having a required current amount by combining, for a current source cell matrix in which current source cells are arranged in a matrix, a plurality of the respective current source cells. In order to solve the problem that, due to a variation that has a fixed tendency such as a process variation or the like, current values of respective current sources differ largely at two ends of the current source cell matrix, and linearity is not obtained, the configuration is such that a current course cell matrix is divided into a plurality of blocks arranged symmetrically with respect to the center of the matrix arrangement, and constant current sources are formed from combinations of equal numbers of current source cells selected from each block in a row or a column direction. In Patent Document 1, the current source cells with the matrix arrangement as center are non-active (unused) as shown in FIG. 5 of Patent Document 1, or are removed as shown in FIGS. 7A and 7B of Patent Document 1. It is to be noted that this Patent Document 1 does not disclose a measure for variation in a current mirror configuration provided with a reference element.

Patent Document 2 discloses a current source cell layout structure in which current source cells are arranged in a matrix, wherein the configuration is such that, even if output current of a current source cell has a variation in a peak form or a valley form, the variation is eliminated by combining current source cells so as to reduce the variation, and variation due to IR drop due to wiring resistance is mostly eliminated.

Patent Document 3 discloses a semiconductor integrated circuit with, as a function cell structure having an arrangement of elements forming a current mode logic (CML) circuit, a cross type structure in which the elements are arranged so as to have rotational symmetry every 90° with respect to cell center point, or a cross type structure arranged by folding axis-symmetrically with respect to X and Y axes passing through the cell center.

Below, a description is given concerning a current mirror which includes a second current source that outputs a second current (mirror current) corresponding to a first current that flows in a first current source. FIG. 1 shows a circuit configuration of a well known current mirror. Referring to FIG. 1, MOS transistors M1 and M2, have sources connected to a power supply VSS, and gates coupled together. The MOS transistor M1 has a drain connected to a gate. Since a drain-to-source voltage ($V_{GS1}$) of the MOS transistor M1 is higher than a threshold voltage $V_{TH}$, and a drain-to-gate voltage ($V_{DG1}$) is 0V, the MOS transistor M1 operates in a saturated region. When a drain-to-source voltage ($V_{DS2}$) of the MOS transistor M2 is larger than $V_{GS1}$-$V_{TH1}$, both of the MOS transistors M1 and M2 operate in a saturated region. A drain-to-source current $I_{DS}$ of a MOS transistor in a saturated region is given by the following.

$$I_{DS} = \frac{\beta}{2}(V_{GS} - V_{TH})^2 \times (1 + \lambda V_{DS}) \qquad (1\text{-}1)$$

In (1-1),
$V_{GS}$ is a gate-to-source voltage, $V_{TH}$ is a threshold voltage,
$V_{DS}$ is a drain-to-source voltage,
$\lambda$ is a channel length modulation coefficient, and
$\beta$ is a gain coefficient.
$\beta$ is given by the following Equation (1-2), where $\mu$ is a channel mobility, $C_{ox}$ is a gate capacitance per unit area, W is a channel width, and L is a channel length.

$$\beta = \mu C_{OX}\left(\frac{W}{L}\right) \qquad (1\text{-}2)$$

With drain-to-source currents $I_D$ of the MOS transistors M1 and M2, given by Equation (1-1), as $I_{IN}$ and $I_{OUT}$, respectively, a matching accuracy is given by $I_{OUT}/I_{IN}$.

$$\frac{I_{OUT}}{I_{IN}} = \frac{(W_2/L_2)(V_{GS2} - V_{TH2})^2(1 + \lambda_2 V_{DS2})}{(W_1/L_1)(V_{GS1} - V_{TH1})^2(1 + \lambda_1 V_{DS1})} \qquad (2)$$

If, with regard to the MOS transistors M1 and M2, the gate-to-source voltages $V_{GS1}$ and $V_{GS2}$, the threshold voltages $V_{TH1}$ and $V_{TH2}$, the drain-to-source voltages $V_{DS1}$ and $V_{DS2}$, and the channel length modulation coefficients $\lambda_1$ and $\lambda_2$ are assume to be equal, or if a channel length modulation effect is assumed to be negligible, a ratio of input current $I_{IN}$ and output current $I_{OUT}$ (current gain) is given by the following Equation (3).

$$\frac{I_{OUT}}{I_{IN}} = \frac{(W_2/L_2)}{(W_1/L_1)} \qquad (3)$$

When W/L of the MOS transistors M1 and M2 are the same as each other, $I_{IN}N=I_{OUT}$. In order to a current ratio of the input current $I_{IN}$ and the output current $I_{OUT}$ to be 1:N, for example, the MOS transistor M1 is connected to N MOS transistors M2 having the same W, which are connected in parallel.

Consideration is given to variation in characteristic of MOS transistors forming a current mirror, for example, by separating components of variation corresponding to a Gaussian noise (in Non-Patent Document 1, referred to as a local variation), and variation due to a position (in Non-Patent Document 1, referred to as a global variation). An overview is given below of transistor variation, based on a description of Non-Patent Document 1. It is to be noted that in what follows, the description is given referring to a variation model described in Non-Patent Document 1, for convenience of the description. However, this does not exclude any variation model other than the variation model described in Non-Patent Document 1.

Regarding a transistor circuit characteristic P, with a characteristic $P_O$ of a transistor $M_0$ at a point of origin (0, 0) as a reference, a characteristic $P_i$ of a transistor $M_i$ at $(\Delta x, \Delta y)$ is given by Equation (4), as a first order model. That is, the variation of the characteristic $P_i$ (a bar in Equation (4) indicates an average) is determined by a position $(\Delta x, \Delta y)$ with respect to the characteristic $P_O$ of the transistor $M_0$ (Non-Patent Document 1, page 26, Equation (2.8)).

$$\overline{P}_i = \overline{P}_0 + \frac{\partial P}{\partial x}\Delta x + \frac{\partial P}{\partial y}\Delta y \qquad (4)$$

An output current error of a current mirror including a MOS transistor (M1 in FIG. 1) receiving an input current $I_{IN}$ as input and a MOS transistor (M2 in FIG. 1) outputting an output current $I_{OUT}$, is represented by a dimension WL of the MOS transistors and a distance ($\Delta x$) between transistors, as in the following Equation (5) (Non-Patent Document 1, page 40, Equation (2.46)).

$$\frac{\Delta I}{I_{IN}} = \frac{I_{OUT} - I_{IN}}{I_{IN}} \cong \frac{A_{\Delta I}}{\sqrt{WL}} \cdot (rand) + \frac{\partial I}{\partial x} \cdot \Delta x \qquad (5)$$

In Equation (5), "rand" in the first term on the right hand side is a standard normal distribution, and $A_{\Delta I}$ is a variation model parameter. The first term in Equation (5) corresponds to local variation of Gaussian noise, and the second term corresponds to variation depending on distance (global variation). When transistor size (gate size) WL is large, the local variation is small. Conversely, the smaller the gate size of a transistor, the larger the local variation is.

From the second term of Equation (5), the variation component that depends on a distance of the output current error of the current mirror is proportional to the distance ($\Delta x$) between centers of the MOS transistors (M1 and M2 in FIG. 1) that form the current mirror. That is, the farther apart the distance between the transistors, the more the output current errors differ. With regard to a characteristic q other than a transistor output current error (($I_{OUT}-I_{IN}$)/$I_{IN}$), similar to Equation (5), a relative accuracy thereof $\Delta q$ (index indicating matching level of transistor characteristic) is represented by a transistor gate size WL and a distance $\Delta x$ between transistors, as in the following Equation (6) (Non-Patent Document 1, page 41, Equation (2.54)).

$$\Delta q = \frac{A_{\Delta q}}{\sqrt{WL}} \cdot (rand) + \frac{\partial q}{\partial x} \cdot \Delta x \qquad (4)$$

The local variation of the first term of Equation (6) indicates that a fluctuation range of the transistor characteristic is determined by the gate size (WL) of the transistor.

With regard to current mirror transistor layout, a configuration in which two transistors B-1 and B-2 on an output side are laid out in parallel in line is shown in FIGS. 2A and 2B. FIG. 2A is a circuit diagram, and FIG. 2B is a layout diagram. As shown in FIG. 2A, sources of MOS transistors A, B-1, and B-2 are connected to a power supply VSS, gates are connected in common, and a drain and gate of the MOS transistor A are connected.

In FIG. 2B, rectangular regions of A, B-1, and B-2 indicate gates (electrodes) of the transistors A, B-1, and B-2, with a short side corresponding to a gate length (channel length) L and a long side which corresponds to a width of a diffusion layer, corresponding to a gate width (channel width) W. A rectangular region on both sides of the gate represents a metal interconnect (1 layer) on a diffusion layer (drain, source), and squares indicate contact (contact hole, plug). The transistors B-1 and B-2 are formed from a unit cell structure identical to the transistor A. Circuit parameters of the transistors A, B-1 and B-2, such as channel width (W) and channel length (L), being gate size, are identical to one another. A sum of output currents (drain currents) of the transistors B-1 and B-2 is double an input current of the transistor A.

In FIG. 2B, if a distance in a channel direction between the transistor A and the transistor B-1 (distance between gate centers) is $\Delta x$, a distance between the transistor A and the transistor B-2 is 2 $\Delta x$. From Equation (5), a difference in distance dependent variations of output current errors of the transistor A and the transistor B-2 is approximately double a difference in distance dependent variations of an output current errors of the transistor A and the transistor B-1.

It is to be noted that, with respect to the current mirror, there are various proposals besides a configuration in which the transistors B-1 and B-2 are laid out in parallel, as in FIG. 2B (Non-Patent Document 1 and Non-Patent Documents 2 and 3). For example, the current mirror can be into a point symmetry type layout such as a layout (common centroid) in which transistors forming a pair are divided into two arranged at opposing corner positions, a line symmetry type layout in which transistors are arranged in parallel or transistors are folded and arranged in parallel, or the like. Among these, the point symmetry type transistor pair is not affected by global variation.

[Patent Document 1] US2001/054975A1, U.S. Pat. No. 6,433,721B2 corresponding to JP Patent Kokai Publication No. JP-P2002-009247A

[Patent Document 2] US2007/126617A1, U.S. Pat. No. 7,420,495B2 corresponding to JP Patent Kokai Publication No. JP-P2007-158166A

[Patent Document 3] U.S. Pat. No. 6,075,260A corresponding to JP Patent No. 3169883

[Non-Patent Document 1] "Research concerning Performance Variation Analysis of Integrated Circuits", Okada, Kenichi, Internet URL: http://repository.kulib.kyoto-u.ac.jp/dspace/bit stream/2433/59292/1/D_Okada_Kenichi.pdf

[Non-Patent Document 2] H. Elzinga, "On the Impact of Spatial Parametric Variations on MOS Transistor Mismatch", Proceedings of IEEE International Conference of Microelectronic Test Structures, Vol. 9, pp. 173-177, March 1996.

[Non-Patent Document 3] J. Bastos, M. Steyert, B. Graindourze, and W. Sansen, "Matching of MOS Transistors with Different Layout Styles", Proceedings of IEEE International Conference of Microelectronic Test Structures, Vol. 9, pp. 17-18, March 1996.

SUMMARY

The entire disclosures of Patent Documents 1 to 3, and Non-Patent Documents 1 to 3 are incorporated herein by reference thereto. The following analysis is given by the present inventor.

As described above, in Non-Patent Documents 1 to 3, there are proposed current mirrors that are not affected by a variation depending on distance between transistors. The present invention provides a semiconductor device having a layout and wiring structure that reduces a variation of an output current error of a current source device which needs a relative accuracy.

According to the present invention, there are provided a semiconductor device comprising a first transistor forming a first current source, and plural second transistors forming one second current source or plural second current sources, each generating a current associated with a current from the first current source, wherein the plurality of second transistors are arranged in a surrounding area of the first transistor, among the plurality of second transistors plural transistors arranged in the same direction are arranged at an equal distance from each other, with the first transistor as center, and the first and second transistors have the same current supply capability as each other.

According to the present invention, there is provided a semiconductor device comprising: a first transistor forming a first current source, and plural second transistors forming one second current source or plural second current sources, each generating a current associated with a current from the first current source, wherein plural transistors, being at least a portion of the plurality of second transistors and being arranged in the same direction, are arranged at an equal distance from each other, having the first transistor as a reference, within a first frame indicating a surrounding area of the first transistor and with the first transistor as center, and the first and second transistors have the same current supply capability as each other.

According to the present invention, it is possible to make output current errors of a current source uniform, with respect to variation depending on distance between transistors.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTIONS OF THE DRAWINGS

FIGS. 4A and 4B are diagrams (comparative example, relationship diagram) showing a circuit in which output transistors of a current mirror are arranged in parallel, and a layout configuration.

FIGS. 6A and 6B are diagrams showing an example of wiring of FIG. 5.

PREFERRED MODES

One of representative examples of a technological concept of the present invention which seeks to solve at least one of the above mentioned problems will be described. The claimed contents of the present application are not limited to the technological concept below described but described in the claims of the present application. According to the present invention, with a layout position of a first transistor receiving a current, as a reference, plural transistors each delivering an output current are arranged equally in a surrounding area of the first transistor. Furthermore, there is provided an interconnect structure in which characteristics (parasitic capacitance, wiring resistance) of plural wires respectively connected to the plurality of transistors are made equal. For example, a layout of a semiconductor device provided with a transistor A forming a first current source and a plurality of MOS transistors B forming second current sources with current of the first current source as a reference, is such that the MOS transistors B are arranged equally in a surrounding area of the MOS transistor A, and with regard to wires to the same terminal of the MOS transistor A and the plurality of transistors B from an input current terminal and an output current terminal, a characteristic thereof (parasitic resistance, capacitance) is made equal, among the wires.

First Exemplary Embodiment

Figure 2A:
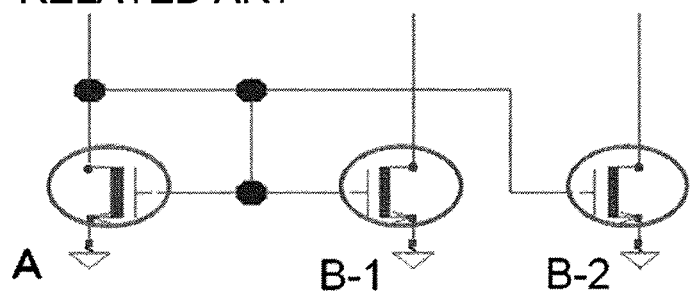
FIGS. 2A and 2B are diagrams (comparative example, relationship diagram) showing a circuit in which output transistors of a current mirror are arranged in parallel, and a layout configuration.
Figure 2B:
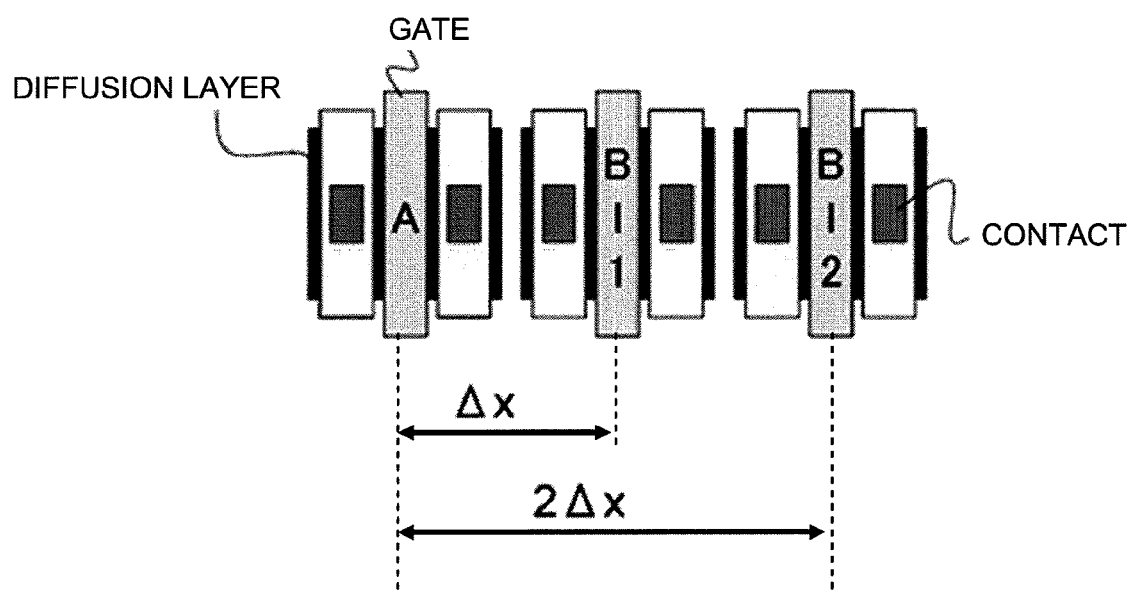
Figure 3:
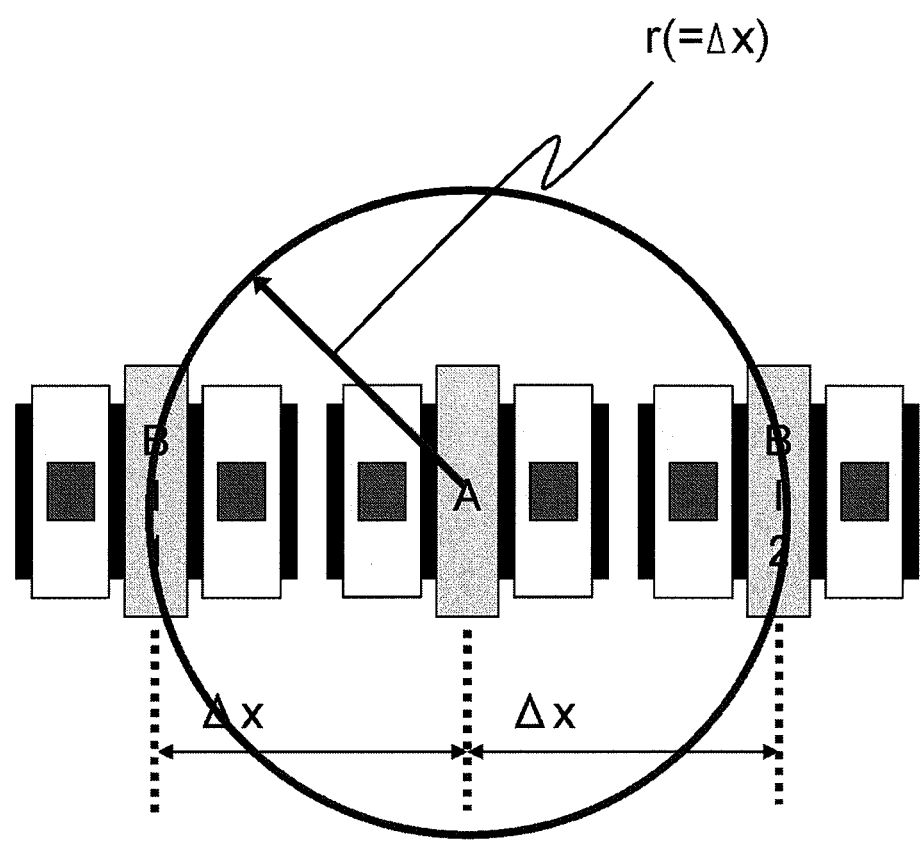
FIG. 3 is a diagram showing an example (first exemplary embodiment) of a layout configuration according to the present invention.

According to the present invention, different from the layout shown in FIG. 2B, there is provided a layout shown in FIG. 3 (first exemplary embodiment), in which a MOS transistor A (input side transistor of a current mirror) which forms a first current source, are sandwiched by plural MOS transistors B-1 and B-2 which form second current sources and are arranged along a channel length direction (for convenience, taken as an X axis) on both side of the MOS transistor A, in parallel with mutually equal distance ($\Delta x$) between transistors. In FIG. 3, respective current gains of both the first current source and the plurality of second current sources are "1". A layout according to a technological concept of the present application for a case where the current gains of the second current sources are more than "1" is described later.

A characteristic of the structure of FIG. 3 will be described in detail. For the first current source (transistor A) having a current gain of "1", two of the second current sources (transistors B-1 and B-2), which are mutually independent and have respective current gains ("1"), the same as the first current source, are arranged in the same direction (X axis direction), at equal distances from the input side transistor A.

In the present exemplary embodiment, two of the second current sources may be arranged in a Y axis direction.

Furthermore, with regard to sandwiching the transistor A and arranging in parallel on both sides thereof, with a channel region (inverted region where current flows due to a gate voltage) of the transistor A as a reference point, the shape of the channel region in question, which is a polygon (in FIG. 3, a rectangular channel shape in the Y axis direction), is treated as a point, and with this point as a center, in a surrounding area on both sides thereof, the plurality of second current sources (plural transistors B) that are mutually independent are arranged.

One of features of the present invention is that with the transistor A, shown in FIG. 3 as a reference (an inverted channel region of the transistor A as a reference point), the transistors B-1 and B-2 are arranged at a distance of a radius r corresponding to $\Delta x$. A reason for this will be described later in comparison with a layout of FIG. 2B.

In FIG. 3, each of the MOS transistors B-1 and B-2, similar to FIG. 2B, are formed of a unit cell structure of the same diffusion layer configuration, with the same gate width W and the same gate length L, as the MOS transistor A. It is to be noted that the channel length direction indicates a direction of current flowing between drain and source terminals, and indicates a channel length out of channel width/channel length corresponding to W/L of the MOS transistor. The channel width (W) relates to total amount of current, and the channel length (L) relates to current amount per unit area. The channel width (W) may be referred to as gate width (W), and the channel length (L) may be referred to as gate length (L). The "inverted channel region" may be referred to simply as "channel region"

Below, in order to simplify the description of the exemplary embodiment, as an example, according to the above-mentioned Non-Patent Document 1, an analysis is performed using a variation model (first order model) that depends on an inter-distance transistor. However, a variation analyzing method is not limited to the above method. An analysis method below described is not to be understood as limiting the present invention. A difference in variation components depending on an inter-transistor distance $\Delta x$ of a circuit characteristic q (for example, an output current error) of the MOS transistor B-1, with regard to the MOS transistor A, is given by Expression (7), if it is assumed that respective local variation components are equal.

$$-\frac{\partial q}{\partial x}\Delta x \tag{7}$$

In the same way, a difference in variation component depending on an inter-transistor distance $\Delta x$ of a circuit characteristic q (for example, output current error) of the MOS transistor B-2, with regard to the transistor A is given by Expression (8), if it is assumed that local variation components are equal.

$$+\frac{\partial q}{\partial x}\Delta x \tag{8}$$

Variation components (7) and (8) depending on an inter-transistor distance of a circuit characteristic q (for example, output current error) of the MOS transistor B-2 of the present invention (FIG. 3), with regard to the MOS transistor A, are reduced more than the MOS transistor B-2 of FIG. 2B.

Variance $\sigma^2(\Delta P)$ of a circuit characteristic P is calculated by Equation (9) based on a sum of rectangular regions of local variation and variation $S_{\Delta P}$ related to distance D (refer to Non-Patent Document 1, page 29, Equation (2.25), and Non-Patent Document 2). Equation (9) corresponds to the sum of the square of the first term and the square of the second term of Equation (5) or Equation (6).

$$\sigma^2(\Delta P) = \frac{A_P^2}{WL} + S_{\Delta P}^2 D^2 \tag{9}$$

In the configuration of FIG. 2B, the maximum value of the distance D is 2 $\Delta x$, and from Equation (9), the term $(S_{\Delta P})^2 4 (\Delta x)^2$ that is proportional to the square of distance 2 $\Delta x$, namely, $4(\Delta x)^2$, is included in the variance $\sigma^2(\Delta P)$ of the circuit characteristic P of the transistor B-2. Contrary to this, according to the present invention (FIG. 3), $(S_{\Delta P})^2(\Delta x)^2$ contributes only to the variance $\sigma^2(\Delta P)$ of the circuit characteristic P of the transistors B-1 and B-2, and hence it is possible to suppress variation of the circuit characteristic.

From Expressions (7) and (8), since respective variation components are different in polarity and the same in magnitude, when the sum of the output current of the MOS transistors B-1 and B-2 is taken with a current gain being equal to 2, variation components of the output current sum, each of which depends on an inter-transistor distance of an output current errors of the MOS transistors B-1 and B-2 in a variation model, are cancelled.

Second Exemplary Embodiment

Comparative Example

FIG. 4A shows a comparative example of the present invention. FIG. 4B shows a circuit configuration of a current mirror. As shown in FIG. 4B, a gate width of a MOS transistor A on an input side of the current mirror is W=5 (note that 5 is a value with a certain unit as reference) and a gate width of a MOS transistor on an output side is W=20. Four output transistors B with a gate width W=5 are arranged in parallel. Inter-transistor distances between MOS transistors B-1, B-2, B-3, and B-4 on the output side and the MOS transistor A on the input side, which is a reference, are respectively Δx, 2 Δx, 3 Δx, and 4 Δx. Therefore, variation components depending on an inter-transistor distance with respect to the transistor A, of a circuit characteristic q (for example, an output current error) of the MOS transistors B-1, B-2, B-3, and B-4, are, respectively as follows, $$\frac{\partial q}{\partial x}\Delta x \quad (10)$$

$$\frac{\partial q}{\partial x}(2\Delta x)$$

$$\frac{\partial q}{\partial x}(3\Delta x)$$

$$\frac{\partial q}{\partial x}(4\Delta x)$$

which are proportional to Δx, 2 Δx, 3 Δx, and 4 Δx, respectively.

Figure 5:
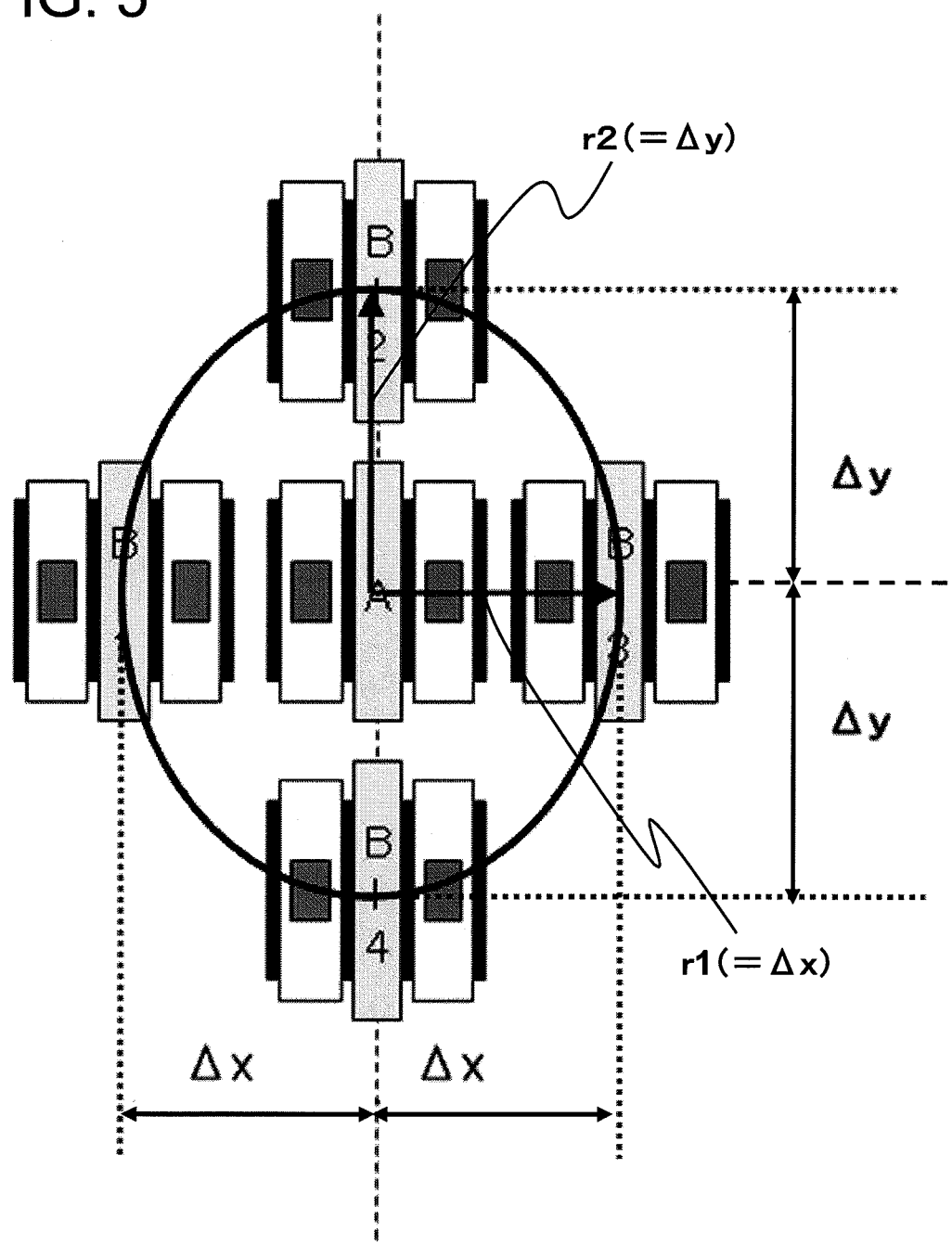
FIG. 5 is a diagram showing an example (second exemplary embodiment) of a layout configuration according to the present invention.

FIG. 5 (second exemplary embodiment), according to the present invention, shows a layout configuration that realizes a circuit configuration of FIG. 4B. As shown in FIG. 5, with the MOS transistor A on the input side of the current mirror as a center, MOS transistors B-1, B-2, B-3, and B-4 are evenly arranged on four sides of the MOS transistor A. The MOS transistors B-1 and B-3 are arranged along a channel length direction (X axis) of the transistor A, sandwiching the MOS transistor A, so that inter-transistor distances (Δx) on both sides are equal. The MOS transistors B-2 and B-4 are arranged such that respective gates are positioned on a straight line with a gate of the MOS transistor A, and on a line extended therefrom, sandwiching the MOS transistor A, inter-transistor distances (Δy) are equal on both sides thereof. Here, with the center of the gate of the MOS transistor A as an origin, center coordinates of the transistors B-1, B-2, B-3, and B-4 are respectively (−Δx, 0), (0, Δy), (0, +Δx), and (0, −Δy). It is to be noted that the inter-transistor distance (Δx) in a case where the channel length direction is the X axis, and the inter-transistor distance (Δy) in a case where the channel width direction is the Y axis, are prescribed by the size of a unit cell region, and gate size (W and L) of the MOS transistor, and these may be the same. In a case where Δx=Δy, variations with respect to output currents are equal, and currents more equal to that of the current source can be supplied. Wire lengths can also have a more equal form.

Analysis of variation in the present exemplary embodiment will be given. Below, in order to simplify the description of the exemplary embodiment, as an example, according to the abovementioned Non-Patent Document 1, an analysis is performed using a variation model (first order model) that depends on an inter-transistor distance. However, a method of analyzing variation is, as a matter of course, not limited to this method, and the analysis method as below is, as a matter of course, not to be understood as limiting the present invention.

In FIG. 5, a variation component depending on an inter-transistor distance Δx with respect to the transistor A, of a circuit characteristic q (for example, output current error) of the MOS transistor B-1 is given by Expression (7), and has a value proportional to Δx.

A variation component depending on an inter-transistor distance Δy with respect to the transistor A, of a circuit characteristic q (for example, output current error) of the MOS transistor B-2 is given by Expression (11), and has a value proportional to Δy.

$$+\frac{\partial q}{\partial x}\Delta y \quad (11)$$

A variation component depending on an inter-transistor distance Δx with respect to the transistor A, of a circuit characteristic q (for example, output current error) of the MOS transistor B-3 is given by Expression (8), and has a value proportional to Δx.

A variation component depending on an inter-transistor distance Δy with respect to the transistor A, of a circuit characteristic q (for example, output current error) of the MOS transistor B-4 is given by Expression (12), and has a value proportional to Δy.

$$-\frac{\partial q}{\partial x}\Delta y \quad (12)$$

From Equation (9), $S_p^2(\Delta x)^2$ is included in a variance $\sigma^2(\Delta P)$ of a circuit characteristic P (for example, output current error) of the transistors B-1 and B-3 on the output side of the current mirror. Furthermore, $S_p^2(\Delta y)^2$ is included in a variance $\sigma^2(\Delta P)$ of the circuit characteristic P of the transistors B-2 and B-4 on the output side of the current mirror.

In a case of a comparative example in FIG. 4A, from Equation (9), $S_p^2(4 \Delta x)^2 = 16 S_p^2(\Delta x)^2$ is included in the variance $\sigma^2(\Delta P)$ of the circuit characteristic P (for example, output current error) of the transistor B-4 at the farthest from the MOS transistor A, and according to the layout of the present exemplary embodiment, it is understood that the variation of the circuit characteristic q (for example, output current error) is reduced remarkably.

Since Expressions (7) and (8) differ in polarity and have the same magnitude, and that Expressions (11) and (12) differ in polarity and have the same magnitude, the sum of output current of the MOS transistors B-1 and B-3, and B-2 and B-4 is taken, and a current gain is 4, in an error of the summed current of the output currents of the transistors, variation components depending on distance of the output current errors of the respective transistors are cancelled.

In FIG. 5, with regard to the current mirror having a current gain of 4, against the first current source (transistor A) for which current gain is 1, four transistors B-1, B-2, B-3, and B-4 on the output side, each of which has a current gain (=1) the same as the first current source, are arranged at equal distances and at equal intervals every 90 degrees, from the input side transistor A. The four output side transistors B-1, B-2, B-3, and B-4 form one current source (second current source). In the present exemplary embodiment, N output side transistors B may be arranged each at a position an equal distance from the input side transistor A, and separated by an angle at the same interval from each other, in a concentric circle or at the apex of a regular polygon.

In the present exemplary embodiment, as described above, in a layout structure where with the MOS transistor A as a center, MOS transistors B are arranged symmetrically in a surrounding area of the MOS transistor A, a configuration is such that wires in an interconnect layer, wire length, and electrical characteristic are made uniform.

In more detail, the arrangement of a transistor A as a center indicates a channel region of the transistor A (an inversion region where current flows according to a gate voltage), and is an arrangement with the shape of the channel region in question, which is polygonal (in FIG. 5, a rectangular channel shape in a Y axis direction), taken as one point, arranging the transistors B in a surrounding area with this point as a center.

The polygon may be said to be a rectangle with a long line segment in the Y axis direction. Furthermore, in FIG. 5, the transistors B-1, B-2, B-3, and B-4 may be said to be arranged in an elliptical region (on an elliptical line) from the channel region of the transistor A. This ellipse is defined by a shape with a radius r1 (=ΔX) in the X axis direction and a radius r2 (=ΔY) in a Y axis direction.

FIGS. 6A and 6B are diagrams illustrating a wiring structure of an exemplary embodiment of the present invention. FIG. 6A is a diagram showing an example of a wiring structure with regard to the layout of FIG. 5, and FIG. 6B is a diagram showing a circuit configuration thereof. A drain and gate of the MOS transistor A on an input side of the current mirror, and gates of the four MOS transistors B-1, B-2, B-3, and B-4 on the output side are connected to PIN_A, drains of the four MOS transistors B-1, B-2, B-3, and B-4 on the output side are connected in common to PIN_B, and sources of the transistors A and B-1 to B-4 are connected to a power supply VSS.

In FIG. 6A, 1-1 to 1-5 are wires of a first interconnect layer, 2-1 to 2-5 are wires of a second interconnect layer, 3-1 to 3-6 are wires of a third interconnect layer, 4-1 to 4-5 are through holes from the second layer to the first layer (or gate electrodes), and 5-1 to 5-5 are through holes from the third layer to contact portions of the first layer.

Referring to FIG. 6A, PIN_A is an input current terminal of a current mirror, and is connected to the wire 2-1 of the second interconnect layer. The wire 2-1 is connected to a connection portion 2-6 and branches from the connection portion 2-6 to each transistor of a connection destination. That is, the wire 2-3 of the second layer connected via the connection portion 2-6 to the wire 2-1 of the second layer, is connected to a gate electrode of the MOS transistor A via the through hole 4-1, and also is connected to a contact portion of a drain diffusion layer. The wire 2-3 is extended to a position of the MOS transistor B-1, and is connected to a gate electrode of the MOS transistor B-1, via the through hole 4-2. The wires 2-2, 2-4, and 2-5 of the second layer branching from the connection portion 2-6, are respectively connected to gate electrodes of the MOS transistors B-2, B-3, and B-4, via the through holes 4-3, 4-4, and 4-5.

The wire 2-1 connected to the terminal PIN_A is connected in the vicinity of a cross point where the wires 2-2 to 2-5 intersect orthogonally. Although there is no particular limitation, in FIG. 6A, the wire 2-1 is connected to the connection portion 2-6 diagonally between the wires 2-3 and 2-5 (at an angle of approximately 45 degrees).

A PIN_B is an output current terminal of the current mirror, and is connected to the wire 3-1 of the third interconnect layer. The wire 3-2 of the third layer connected by the connection portion 3-6 to the wire 3-1 of the third interconnect layer is connected to a contact portion of the drain diffusion layer of the transistor B-1 via the through hole 5-1. The wires 3-3, 3-4, and 3-6 of the third interconnect layer connected by the connection portion 3-6 to the wire 3-1, are respectively connected to contact portions of the drain diffusion layers of the transistors B-2, B-3, and B-4, via the through holes 5-2, 5-3, and 5-4. With regard to the connection portion 3-6 of the third interconnect layer, the wire 3-1 is connected to the vicinity of a cross point where the wires 3-3 to 3-5 intersect orthogonally.

The wire 3-1 connected to the terminal PIN_B is connected to the connection portion 3-6 diagonally between the wiring 3-2 and 3-4 that are orthogonal (at an angle of approximately 45 degrees).

The wire 3-6 of the third layer connected to the power supply VSS is connected to the wire 1-1 of the first interconnect layer via the through hole 5-5, and is connected to a source of the MOS transistors B-1, B-3, B-4, A, and B-2, via the wires 1-2, 1-3, 1-4, 1-5, and 1-6.

In the present exemplary embodiment (FIGS. 6A and 6B), with regard to wiring connecting between the MOS transistor A and the MOS transistors B-1, B-2, B-3, and B-4, in order that a specific output side transistor does not have a wiring resistance (parasitic resistance) or wiring capacitance (parasitic capacitance) different from another output side transistor, wiring connected to the input terminal PIN_A is wired in the same second interconnect layer, wiring connected to the output terminal PIN_B is wired in the same third interconnect layer, wiring connected to the terminals PIN_A and PIN_B is respectively wired to cross connection portions 2-6 and 3-6, and wiring of the same interconnect layer has the same through hole layer/contact layer, and the same number of through hole connections. Therefore, among three transistors, only a specific transistor does not have a through hole transfer (for example, connection from wiring of the third interconnect layer to the second interconnect layer is by a first through hole, and in the second interconnect layer is extended by wiring to an other location, and then is connected from the second interconnect layer at the other location by another through a second through hole to the first interconnect layer, to connect to another through hole). In other words, one feature of the present application enables to suppress the occurrence of a situation in which with regard to plural transistors (B-1, B-2, B-3, and B-4) connected to a transistor A, only a specific transistor among the plurality of transistors has a different wiring length, a different through hole type, and a differed number of through holes from the other transistors.

In the present exemplary embodiment, by connecting the second interconnect layer wires 2-2 to 2-5 that are connected to the gates of the MOS transistors B-1 to B-4, and the second interconnect layer wire 2-1 for connecting to the terminal PIN_A, to the vicinity of a cross intersection of the connection portion 2-6, load and electrical length of the wire 2-1 for connecting the connection portion 2-6 to the terminal PIN_A are distributed uniformly among the respective wires 2-2 to 2-5 that are cross-connected. Contrary to this, in a case of connecting the wire 2-1 to the wire 2-3, for example, a load of the wire 2-1 is seen only in the wire 2-3, and an unbalance occurs among the other wires 2-2, 2-4, and 2-5.

By connecting the third interconnect layer wires 3-2 to 3-5, and the third interconnect layer wire 3-1 for connecting to the terminal PIN_B, to the vicinity of a cross intersection of a connection portion 3-6, length (load) of the second layer wire 3-1 for connecting to the terminal PIN_A is made uniform among the respective wires 3-2 to 3-5 that are cross-connected.

Third Exemplary Embodiment

Figure 7A:
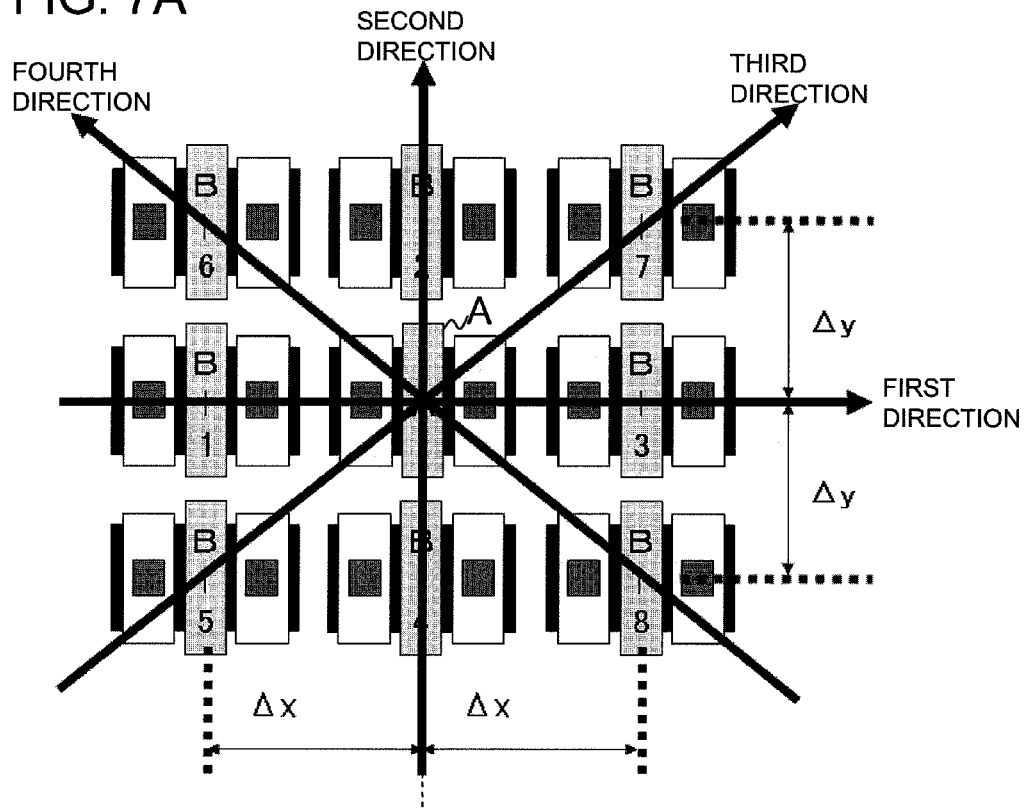
FIGS. 7A and 7B are diagrams showing another example (third exemplary embodiment) of a layout configuration according to the present invention.
Figure 7B:
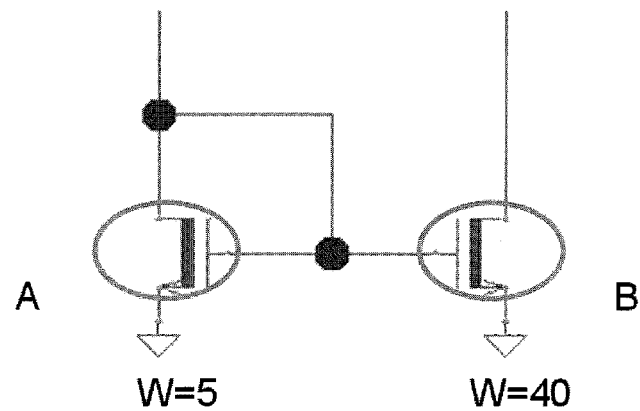

Next, a further exemplary embodiment of the present invention is described. FIGS. 7A and 7B are diagrams in which eight output side MOS transistors B are uniformly arranged in a surrounding area of an input side MOS transistor A of a current mirror. A gate width of the output side MOS transistors B is W=40, while a gate width of the input side MOS transistor A is W=5.

Referring to FIG. 7A, with the MOS transistor A as a center, the transistors B are equally spaced in a row direction and are equally spaced in a column direction, and a transistor array of 3 rows and 3 columns is provided. In addition to four output MOS transistors B-1, B-2, B-3, and B-4 of FIG. 5, in a layout of FIG. 7A, two MOS transistors B-6 and B-7 are added, sandwiching the MOS transistor B-2, on both sides in a channel direction, and two MOS transistors B-5 and B-8 are added, sandwiching the MOS transistor B-4, on both sides in a channel direction.

The output MOS transistors B-1 and B-3 are arranged in a first direction. The output MOS transistors B-2 and B-4 are arranged in a second direction. The output MOS transistors B-5 and B-7 are arranged in a third direction. The output MOS transistors B-6 and B-7 are arranged in a fourth direction.

With the center of a gate of the MOS transistor A as origin, gate coordinates of the MOS transistors B-1 to B-8 are respectively $(-\Delta x, 0)$, $(0, \Delta y)$, $(0, +\Delta x)$, $(0, -\Delta y)$, $(-\Delta x, -\Delta y)$, $(-\Delta x, +\Delta y)$, $(\Delta x, \Delta y)$, and $(\Delta x, -\Delta y)$. Decrease in variation of the four output MOS transistors B-1, B-2, B-3, and B-4 with respect to the transistor A is as described before.

Variation with regard to the present exemplary embodiment is analyzed next. Below, in order to simplify the description of the exemplary embodiment, as an example, according to the abovementioned Non-Patent Document 1 and the like, an analysis is performed using a variation model (first order model) that depends on an inter-transistor distance, but a method of analyzing variation is, as a matter of course, not limited to this method, and the analysis method as below is, as a matter of course, not to be understood as limiting the present invention. Global variation with respect to the transistor A, of a circuit characteristic q (for example, output current error) of the MOS transistor B-5 is given by (13), in a first order model.

$$\frac{\partial q}{\partial x}(-\Delta x) + \frac{\partial q}{\partial y}(-\Delta y) \quad (13)$$

Global variation with respect to the transistor A, of a circuit characteristic q (for example, output current error) of the transistor B-6 is given by (14), in a first order model.

$$\frac{\partial q}{\partial x}(-\Delta x) + \frac{\partial q}{\partial y}\Delta y \quad (14)$$

Global variation with respect to the transistor A, of a circuit characteristic q (for example, output current error) of the transistor B-7 is given by (15), in a first order model.

$$\frac{\partial q}{\partial x}\Delta x + \frac{\partial q}{\partial y}\Delta y \quad (15)$$

Global variation with respect to the transistor A, of a circuit characteristic q (for example, output current error) of the transistor B-8 is given by (16), in a first order model.

$$\frac{\partial q}{\partial x}\Delta x + \frac{\partial q}{\partial y}(-\Delta y) \quad (16)$$

Here, supposing a case where the MOS transistors B are arranged in parallel in line at eight equal intervals ($\Delta x$), similar to a method shown in FIG. 4A, which is a comparative example of the second exemplary embodiment, the distance of the eighth transistor B positioned at the farthest extremity on a straight line in a channel length direction from the MOS transistor A is proportional to 8 $\Delta x$. From the above Equation (9), $S_p^2(8 \Delta x)^2 = 64 S_p^2(\Delta x)^2$ is included in variance $\sigma^2(\Delta P)$ of a circuit characteristic P of the eighth transistor at the farthest extremity. In the same way, $S_p^2(i \Delta x)^2 = i^2 S_p^2(\Delta x)^2$ is included in variance $\sigma^2(\Delta P)$ of a circuit characteristic P of an i-th (i=1 to 7) transistor.

In contrast to this, according to the layout of FIG. 7A (third exemplary embodiment), $S_p^2(\Delta x)^2$ is included in variance $\sigma^2(\Delta P)$ of a circuit characteristic P of the transistors B-1 and B-3 arranged at an equal inter-transistor distance ($\Delta x$) on both sides of an X axis with respect to the transistor A as an origin, $S_p^2(\Delta y)^2$ is included in variance $\sigma^2(\Delta P)$ of a circuit characteristic P of the transistors B-2 and B-4 arranged at an equal inter-transistor distance ($\Delta y$) on both sides of a Y axis, and $S_p^2\{(\Delta X)^2+(\Delta y)^2\}$ is included in variance $\sigma^2(\Delta P)$ of a circuit characteristic P of the transistors B-5 and B-7, and the transistors B-6 and B-8 arranged on both sides sandwiching the transistor A in diagonal directions, and for each, variation is largely reduced in comparison with the eighth transistor at the farthest extremity in a case of arranging the transistors in parallel and in line. In comparison to a case where the third to seventh transistors are arranged in parallel and in line, the variation is largely reduced.

Furthermore, according to the present exemplary embodiment, in a case where a sum is taken of output current of the MOS transistors B-1 to B-8, in a first order model of variation, global variation components of respective output current errors are cancelled in both an X direction and a Y direction.

Fourth Exemplary Embodiment

Figure 8:
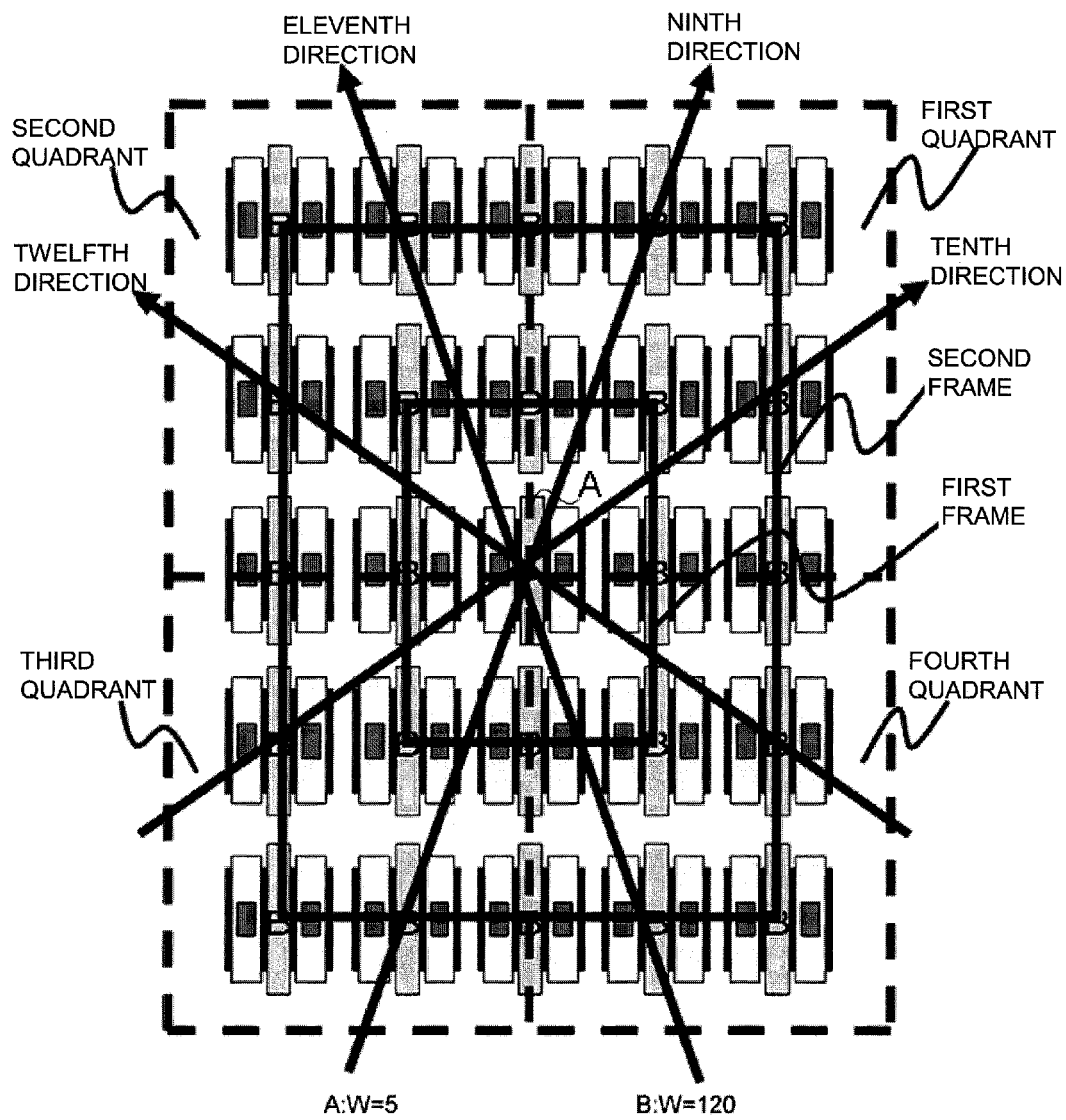
FIG. 8 is a diagram showing a further example (fourth exemplary embodiment) of a layout configuration according to the present invention.

FIG. 8 is a diagram showing a configuration of a further exemplary embodiment of the present invention, with 24 output side transistors B uniformly arranged in a surrounding area of an input side transistor A of a current mirror. A gate width of the output side MOS transistors B is W=120 (current gain=24), while a gate width of the input side MOS transistor A is W=5. Referring to FIG. 8, a 5 row and 5 column transistor array is provided with the MOS transistor A as a center, and the transistors B arranged at equal intervals in a row direction, and equally spaced in a column direction.

Figure 16:
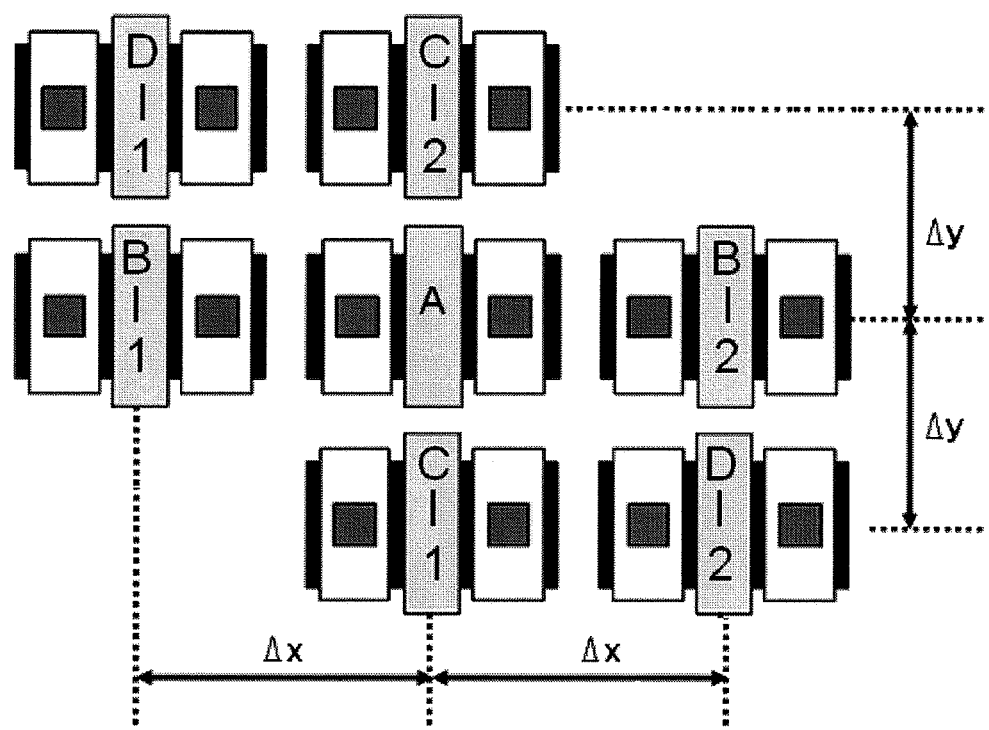
FIG. 16 is a diagram showing a layout configuration of FIG. 15 according to the present invention.

In a layout of FIG. 8, along a periphery (first frame) of the eight transistors B-1 to B-7 of FIG. 7A, 16 transistors B are equally spaced by $\Delta x$ in an X axis direction (channel length direction) and equally spaced by $\Delta y$ in a Y axis direction along a second frame.

At two intersection points of the second frame and the first direction (FIG. 7A), two transistors B sandwiching the transistor A are arranged in a fifth direction the same as the first direction.

At two intersection points of the second frame and the second direction (FIG. 7A), two transistors B sandwiching the transistor A are arranged in a sixth direction the same as the second direction.

At two intersection points of the second frame and the third direction (FIG. 7A), two transistors B sandwiching the transistor A are arranged in a seventh direction the same as the third direction.

At two intersection points of the second frame and the fourth direction (FIG. 7A), two transistors B sandwiching the transistor A are arranged in an eighth direction the same as the fourth direction.

In addition, at two intersection points of the second frame and a ninth direction (FIG. 8), two transistors B are arranged sandwiching the transistor A.

At two intersection points of the second frame and a tenth direction (FIG. 8), two transistors B are arranged sandwiching the transistor A.

At two intersection points of the second frame and an eleventh direction (FIG. 8), two transistors B are arranged sandwiching the transistor A.

At two intersection points of the second frame and a twelfth direction (FIG. 8), two transistors B are arranged sandwiching the transistor A. The transistors A and B are formed from an identical unit cell structure.

It is to be noted that in order to reduce variation, (N×N−1) (N=5 in FIG. 8) output side transistors B are arranged symmetrically, up and down, and to the left and right, with the input side transistor A of a current mirror as a center, and with the current mirror of an N×N transistor structure, a current gain is (N×N−1). The current gain may have a value different from (N×N−1). For example, in FIG. 8 the current gain is 24, but the transistors B may be reduced by one, and the current gain may be 23. In this case, transistors (distant from the transistor A by (±2 Δx, ±2 Δy)) provided at four corners of an outermost periphery, at which variation component difference with regard to the transistor A is largest, may be reduced by one.

In the abovementioned exemplary embodiment, there was given a description of a current mirror circuit in which gates of NMOS transistors B of an output side are connected in common to a connection node of a drain and gate of an NMOS transistor A of an input side, but the transistors A and B may be configured by PMOS transistors in which a source (discharge) current is outputted from a drain of the transistors B.

Figure 1:
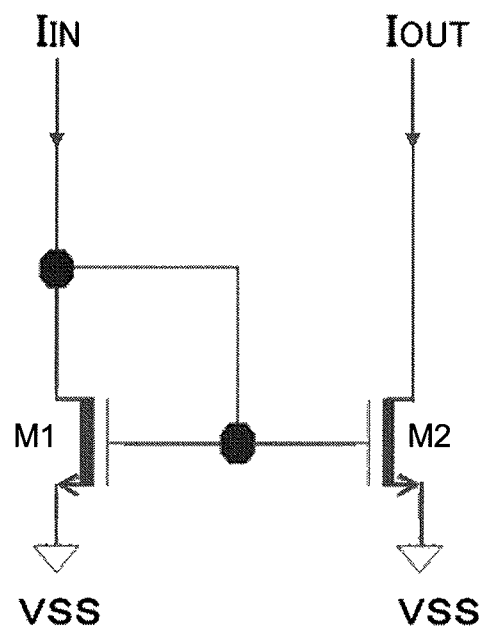
FIG. 1 is a diagram showing a circuit configuration of a current mirror.

The present embodiment is applicable to a cascode current mirror in which a diode-connected MOS transistor and a MOS transistor, having a gate connected to the diode-connected MOS transistor are respectively cascoded to MOS transistors M1 and M2. Another configuration is possible in which a drain of the transistor M1 of FIG. 1 is connected to a power supply VDD via a resistor R, not shown in the diagram, and a reference current $I_{REF}$ (=$(V_{DD}-V_{GS})/R$) is supplied from a drain terminal of the transistor M2. Furthermore, application is also possible as a current source circuit, to a bootstrap current source that is provided with a startup circuit that sets a unity gain current mirror to a desired operation point (input current=output current).

In the abovementioned exemplary embodiment, the plurality of transistors B use a unit cell the same as the transistor A, and with regard to gate dimensions (gate length) of the transistors B, particular mention was not made of a loading effect (a gate dimension of a transistor depend on a width of an element itself or a distance to an adjacent element, so that a deviation occurs from a design value). In order to make a relative accuracy in a circuit characteristic of the transistors B uniform, the gate dimensions after fabrication may be derived from a design value, giving consideration to an adjacent pattern width.

The present invention is not limited to application of a current source using a current mirror. The present invention can be applied to a voltage supply using a current mirror, an amplifier circuit such as a differential circuit or the like, and a signal processing circuit. In the abovementioned exemplary embodiment, a description was given of an example of a case where the present invention is applied to a current mirror circuit, but the present invention is not limited thereto. That is, the present invention can be applied to a circuit in which a current is generated by another current source based on a reference current source. This may be easily understood by a person skilled in the field from a fundamental technical concept of the present application.

Figure 9:
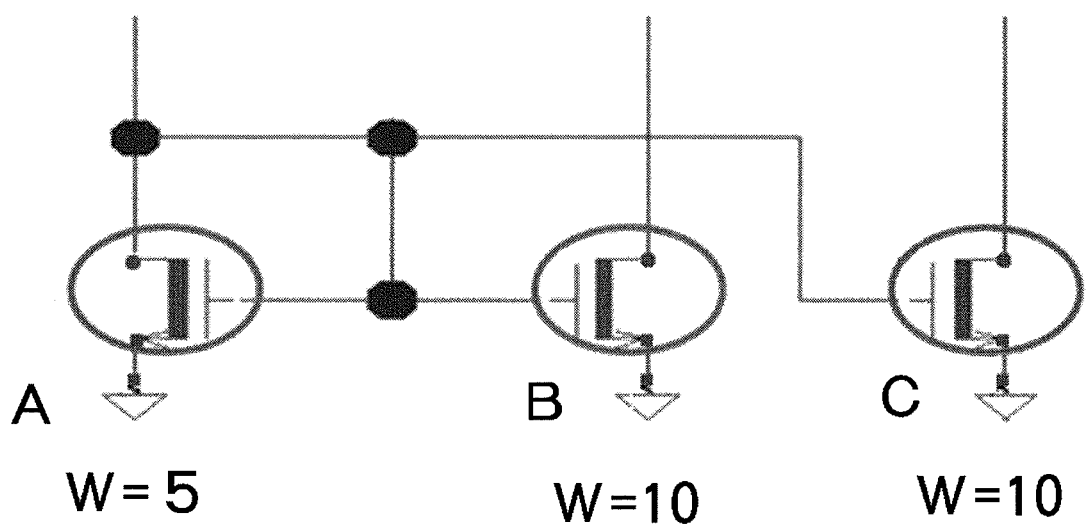
FIG. 9 is a diagram showing a circuit in which parameters of FIG. 2A differ, according to the present invention.

In addition, according to a technical concept of the present invention, application of a combination of the first to the fourth exemplary embodiments also is possible. For example, in the first exemplary embodiment (a layout of FIG. 3, with regard to a circuit diagram of FIG. 2A), in a case of a circuit configuration of FIG. 9 where respective gate widths W of the MOS transistor B-1 and the MOS transistor B-2 are double (W=10) the gate width (W=5) of the MOS transistor A, that is, respective current gains=2, as in FIG. 10 the two MOS transistors B-1 and B-2 may be arranged on both sides (on the same X axis) of the MOS transistor A in a first direction, and two MOS transistors C-1 and C-2 may be arranged on both sides (on the same Y axis) of the MOS transistor A in a second direction.

In a case where the gate width is larger by a factor of 3 or more, further expansion is possible, in a Z axis (a third and fourth direction) that are angular directions between the X axis and Y axis respectively.

Figure 11:
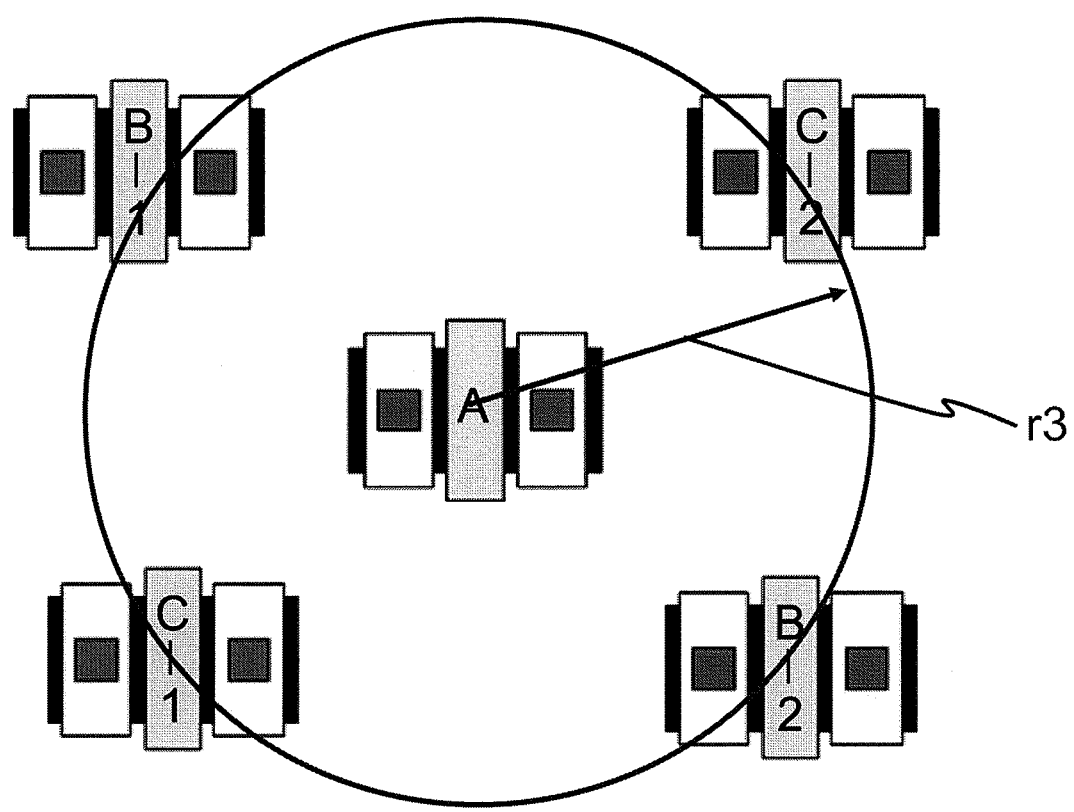
FIG. 11 is a diagram showing another layout configuration of FIG. 9 according to the present invention.

As shown in FIG. 11, the two MOS transistors B-1 and B-2, and the two MOS transistors C-1 and C-2 can be arranged at mutually equal distances (radius r3 (indicating a long segment length, among ΔX and ΔY) from the transistor A.

One of either of the two MOS transistors B-1 and B-2 and the two MOS transistors C-1 and C-2 is in a first direction and the other is in a second direction.

There is no difficulty in matching the first direction to an absolute X axis or Y axis. Therefore, the invention provides an example of a most ideal arrangement that reduces variation with respect to an output current error of a current source device having a required relative accuracy. This may be easily understood by a person skilled in the field from a fundamental technical concept of the present application.

Figure 10:
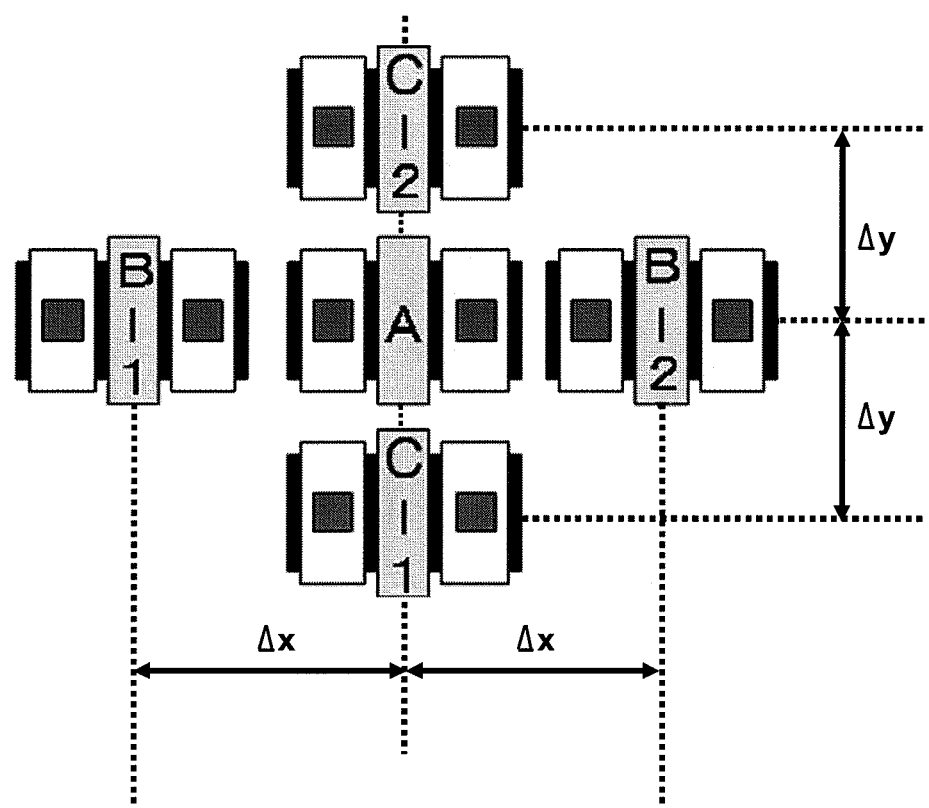
FIG. 10 is a diagram showing a layout configuration of FIG. 9 according to the present invention.

With this type of consideration, it is understood that, since a layout as shown in FIG. 10 has a first frame of a rectangular shape with ΔX shorter than ΔY (in other words, an elliptical frame), it is possible to reduce variation with respect to an output current error of the current source device that has a required relative accuracy more than in FIGS. 2A, 2B, 4A and 4B cited as comparative examples, and area of the overall layout is made efficient.

On the other hand, it is understood that a layout shown in FIG. 11 is a most ideal arrangement that reduces variation with respect to an output current error of a current source device having a required relative accuracy.

In addition, according to a technical concept of the present invention, application of a combination of the first to the fourth exemplary embodiments is also possible.

Figure 12:
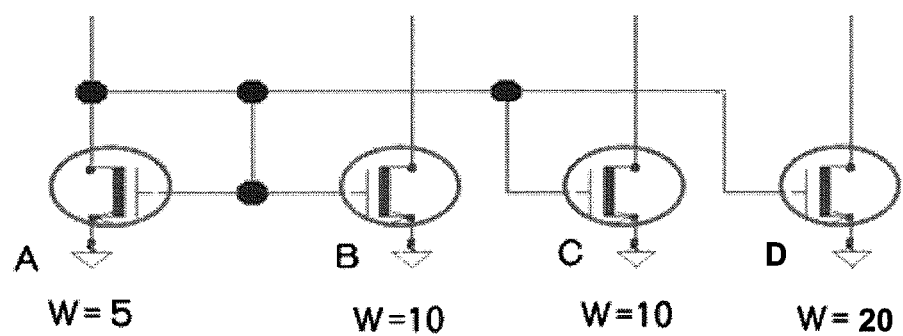
FIG. 12 is a diagram showing a circuit in which output transistors of a current mirror are arranged in parallel, according to the present invention.
Figure 13:
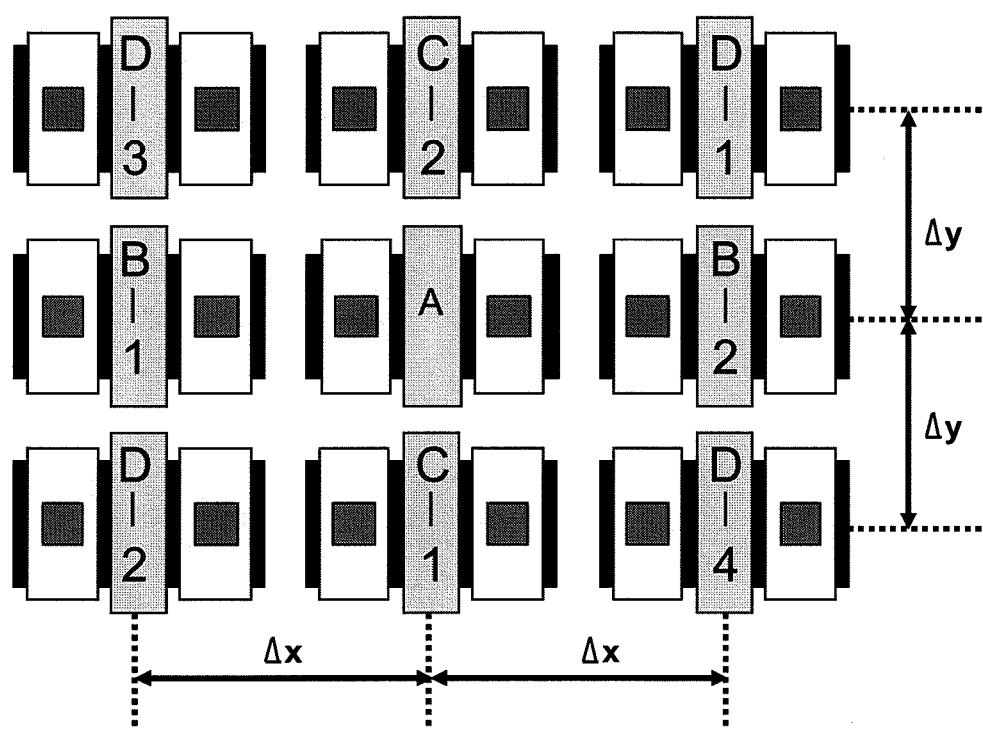
FIG. 13 is a diagram showing a layout configuration of FIG. 12 according to the present invention.

For example, in the first exemplary embodiment (the layout of FIG. 3, with regard to the circuit diagram of FIG. 2A), in a case of a circuit configuration of FIG. 12 where respective gate widths W of the MOS transistor B-1 and the MOS transistor B-2 are double (W=10) the gate width (W=5) of the MOS transistor A, and a third output MOS transistor D is added, and a gate width W of the output MOS transistor D is four times (W=20) the gate width (W=5) of the MOS transistor A, that is, a case where respective current gains=2 or 4, as shown in FIG. 13, the two MOS transistors B-1 and B-2 may be arranged on both sides (on the same X axis) in a first direction of the MOS transistor A, the two MOS transistors C-1 and C-2 may be arranged on both sides (on the same Y axis) in a second direction of the MOS transistor A, the two MOS transistors D-1 and D-2 may be arranged on both sides in a third direction of the MOS transistor A, and the two MOS transistors D-3 and D-4 may be arranged on both sides in a fourth direction of the MOS transistor A.

Figure 14:
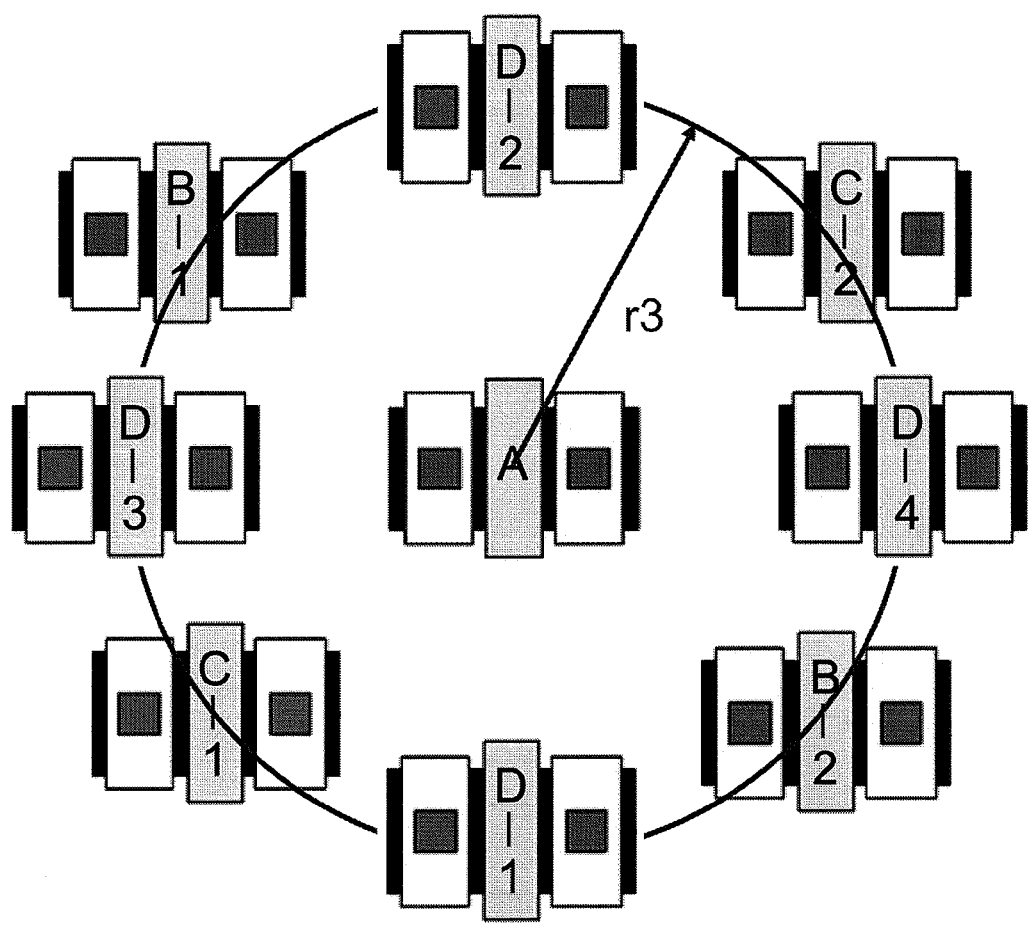
FIG. 14 is a diagram showing another layout configuration of FIG. 12 according to the present invention.

All of the transistors B, C, and D, as shown in FIG. 14, can be arranged at mutually equal distances (a radius r3 (=ΔX, ΔY)) from the transistor A.

In addition, according to a technical concept of the present invention, application of a combination of the first to the fourth exemplary embodiments is also possible.

Figure 15:
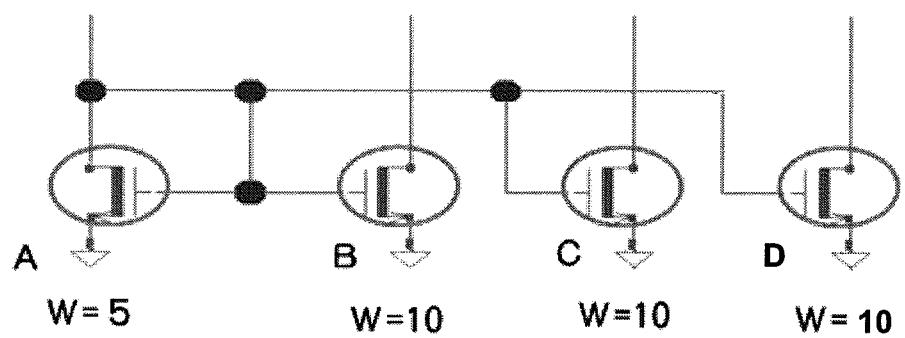
FIG. 15 is a diagram showing a circuit in which output transistors of a current mirror are arranged in parallel, according to the present invention.

For example, in the first exemplary embodiment (the layout of FIG. 3, with regard to the circuit diagram of FIG. 2A), respective gate widths W of the MOS transistor B-1 and the MOS transistor B-2 are double (W=10) the gate width (W=5) of the MOS transistor A, in a case of a circuit configuration of FIG. 15 where the third output MOS transistor D is added and the gate width W of the output MOS transistor D is double (W=10) the gate width (W=5) of the MOS transistor A, that is, a case where respective current gains=2, as shown in FIG. 16, the two MOS transistors B-1 and B-2 may be arranged on both sides (on the same X axis) in a first direction of the MOS transistor A, the two MOS transistors C-1 and C-2 may be arranged on both sides (on the same Y axis) in a second direction of the MOS transistor A, and the two MOS transistors D-1 and D-2 may be arranged on both sides in a third direction or a fourth direction of the MOS transistor A.

All of the transistors B, C, and D, as shown in FIG. 14, can be arranged at mutually equal distances (a radius r3) from the transistor A.

If the third direction or the fourth direction is 45 degrees, being halfway between the first direction (X axis) and the second direction (Y axis), r3 is $\sqrt{2\Delta Y}$. Furthermore, as in FIGS. 6A and 6B, an ellipse is also possible.

In addition, according to a technical concept of the present invention, application of a combination of the first to the fourth exemplary embodiments is also possible.

Figure 17:
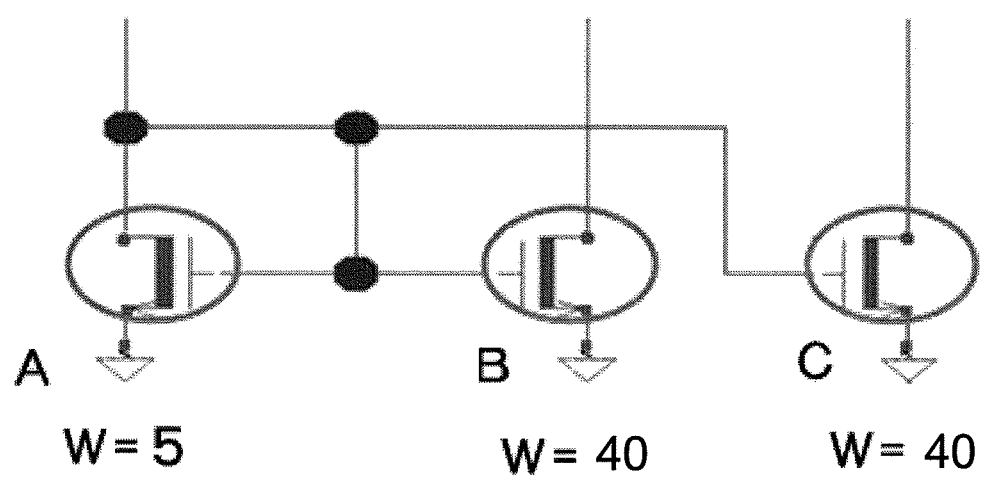
FIG. 17 is a diagram showing a circuit in which output transistors of a current mirror are arranged in parallel, according to the present invention.
Figure 18:
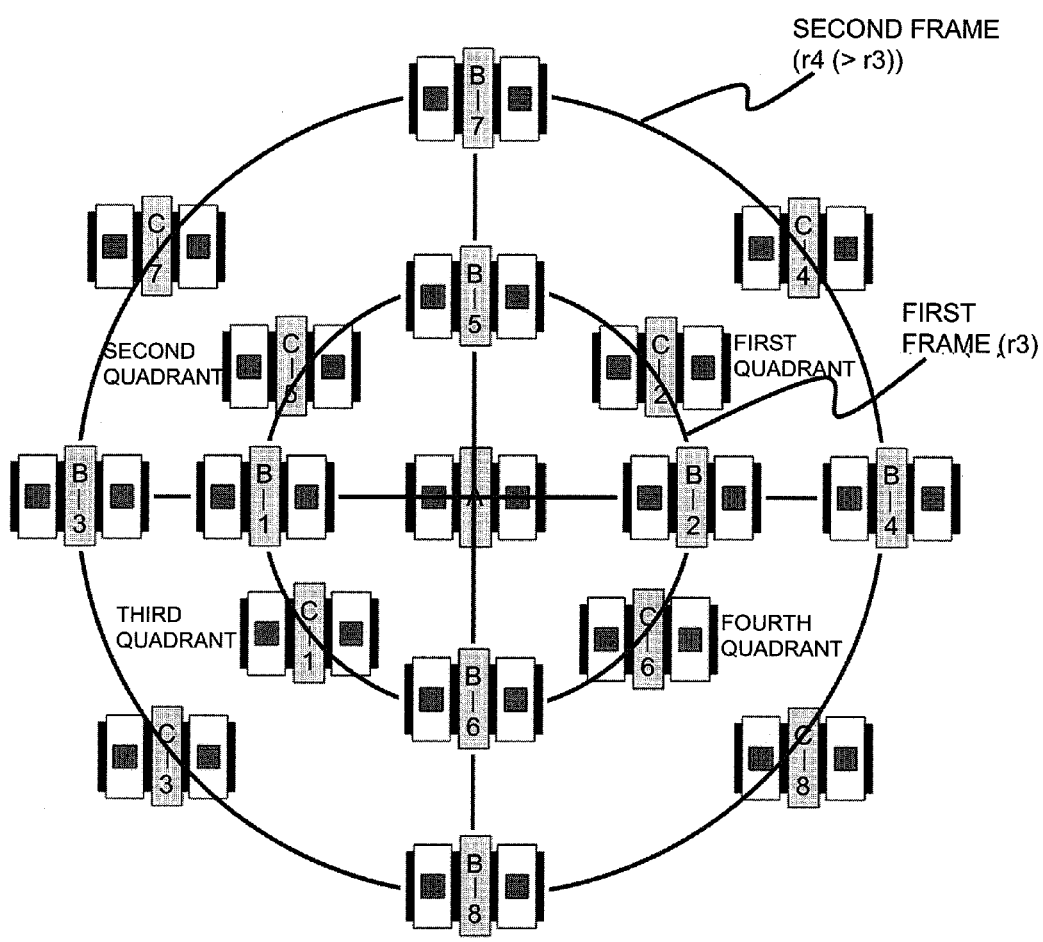
FIG. 18 is a diagram showing a layout configuration of FIG. 17 according to the present invention.

For example, in the first exemplary embodiment (the layout of FIG. 3, with regard to the circuit diagram of FIG. 2A), in a case of a circuit configuration of FIG. 17 where respective gate widths W of the MOS transistor B-1 and the MOS transistor B-2 are eight times (W=40) the gate width (W=5) of the MOS transistor A, that is, respective current gains=8, as shown in FIG. 18, the four MOS transistors B-1 to B-4 are arranged on both sides (on the same X axis) in a first direction of the MOS transistor A, two by two, corresponding to a first frame and a second frame, and the four MOS transistors B-5 to B-8 are arranged on both sides (on the same Y axis) in a second direction of the MOS transistor A, two by two, corresponding to the first frame and the second frame.

On the other hand, the four MOS transistors C-1 to C-4 are arranged on both sides in a third direction of the MOS transistor A, two by two, corresponding to the first frame and the second frame, and the four MOS transistors C-5 to C-8 are arranged on both sides in a fourth direction of the MOS transistor A, two by two, corresponding to the first frame and the second frame.

The first frame may be substantial a perfect circle (true circle) the same as the r3 frame described in FIG. 14, and the second frame may be a perfect circle external to the first frame. The first and second frames are, as a matter of course, not limited to being perfect circles and may, for example, be ellipses.

In addition, there is no problem if the transistors (C-1 to C-4, and C-5 to C8) arranged at respective intersections of the third and fourth directions and the first and second frames belong to quadrants (first to fourth quadrants) where the respective transistors are arranged with respect to the first and second frames.

For example, the transistors C-3 and C-4 arranged in the first and third quadrant may be arranged on the respective corresponding second frame, and there is no problem with respective angles from the transistor A. In this way, the layout is flexible.

In addition, in FIG. 18, for example, in a case where the gate width (W) of an output transistor B or C increases (for example, a transistor B increases from B=40 to 50), in the manner as in FIG. 8, transistors corresponding to respectively transistors B with increased gates, may be added between the transistors B-7 and C-4, on the second frame, and between the transistors B-3 and C-3, on the second frame.

In addition, arrangement of several of the respective transistors B and transistors C in the first quadrant, the second quadrant, the third quadrant, and the fourth quadrant, is optional.

With the transistor A as a center (reference), for example, if the number of transistors B arranged in the first quadrant and the number of transistors C arranged in the third quadrant balance out, it is possible to reduce variation with respect to an output current error of the current source device having a required relative accuracy. It is possible to have the number of transistors B and C that are respectively arranged in the first quadrant and the third quadrant.

In addition, technology of the present application can be applied to structures of various transistor types, semiconductor substrate structures, and wiring structures connecting transistors and so forth. Furthermore, the claims of the present application can be applied to semiconductor products in general, such as a CPU (Central Processing Unit), MCU (Micro Control Unit), DSP (Digital Signal Processor), ASIC (Application Specific Integrated Circuit), ASSP (Application Specific Standard Circuit), and the like. Furthermore, a device in which the present application is applied can be applied to a semiconductor device such as a SOC (System-On-Chip) a MCP (Multi-Chip-Package), a POP (Package-On-Package) and the like. Furthermore, a transistor may be a Field Effect Transistor (FET) or a bipolar type transistor. Outside of a MOS (Metal Oxide Semiconductor), application is possible to various FETs, such as a MIS (Metal-Insulator Semiconductor), a TFT (Thin Film Transistor), and the like. Application is possible to various types of FET, such as a transistor or the like. Application is also possible to a transistor outside of an FET. Furthermore, a P channel type transistor or a PMOS transistor is a representative example of a first conductivity type transistor, and an N channel type transistor or a NMOS transistor is a representative example of a second conductivity type transistor. Furthermore, there is no limitation to a P type semiconductor substrate, and an N type semiconductor substrate is also possible; a semiconductor substrate of a SOI (Silicon on Insulator) structure is also possible; and semiconductor substrates outside of these are also possible.

It is to be noted that respective disclosures of the above-mentioned Patent Documents and Non-Patent Documents are incorporated by reference into the present document. Modifications and adjustments of embodiments and examples are possible within the bounds of the entire disclosure (including the scope of the claims) of the present invention, and also based on fundamental technological concepts thereof. Furthermore, a wide variety of combinations and selections of various disclosed elements are possible within the scope of the claims of the present invention. That is, the present invention, as a matter of course, includes every type of transformation and modification that a person skilled in the art can realize according the entire disclosure including the scope of the claims and to technological concepts thereof.

The whole or part of the exemplary embodiments disclosed above can be described as, but not limited to, the following supplementary notes.

(Supplementary Note 1)

A semiconductor device is provided with a first transistor forming a first current source, and plurality of second transistors forming one second current source or plurality of second current sources, each generating a current associated with a current from the first current source, wherein the plurality of second transistors are arranged in a surrounding area of the first transistor, among the plurality of second transistors, a plurality of transistors arranged in the same direction are arranged at an equal distance from each other, with the first transistor as center, and the first and second transistors comprising the same current supply capability as each other.

(Supplementary Note 2)

In the semiconductor device described in Supplementary note 1, third and fourth transistors included in the plurality of second transistors are arranged, with the first transistor as center, adjacently to the first transistor, and symmetrically with respect to a first direction.

(Supplementary Note 3)

In the semiconductor device described in Supplementary note 2, fifth and sixth transistors included in the plurality of second transistors are arranged, with the first transistor as center, adjacently to the first transistor, and symmetrically with respect to a second direction that is different from the first direction.

(Supplementary Note 4)

In the semiconductor device described in Supplementary note 3, seventh and eighth transistors included in the plurality of second transistors are arranged, with the first transistor as center, adjacently to the first transistor, and symmetrically with respect to a third direction that is different from the first and second directions.

(Supplementary Note 5)

In the semiconductor device described in Supplementary note 4, ninth and tenth transistors included in the plurality of second transistors are arranged, with the first transistor as center, adjacently to the first transistor, and symmetrically with respect to a fourth direction that is different from the first, second, and third directions.

(Supplementary Note 6)

In the semiconductor device described in Supplementary note 3, a first distance indicating the distance from the first transistor to each of the third and fourth transistors and a second distance indicating the distance from the first transistor to the fifth and sixth transistors are different distances.

(Supplementary Note 7)

In the semiconductor device described in Supplementary note 4, a first distance indicating the distance from the first transistor to each of the third and fourth transistors, a second distance indicating the distance from the first transistor to the fifth and sixth transistors, and a third distance indicating the distance from the first transistor to the seventh and eighth transistors are different distances.

(Supplementary Note 8)

In the semiconductor device described in Supplementary note 5, a third distance indicating the distance from the first transistor to the seventh and eighth transistors and a fourth distance indicating the distance from the first transistor to the ninth and tenth transistors are the same distance.

(Supplementary Note 9)

In the semiconductor device described in Supplementary note 3, a first distance indicating the distance from the first transistor to each of the third and fourth transistors and a second distance indicating the distance from the first transistor to the fifth and sixth transistors are the same distance.

(Supplementary Note 10)

In the semiconductor device described in Supplementary note 4, a first distance indicating the distance from the first transistor to each of the third and fourth transistors, a second distance indicating the distance from the first transistor to each of the fifth and sixth transistors, and a third distance indicating the distance from the first transistor to each of the seventh and eighth transistors are the same distance.

(Supplementary Note 11)

In the semiconductor device described in Supplementary note 3, a first distance indicating the distance from the first transistor to each of the third and fourth transistors, a second distance indicating the distance from the first transistor to each of the fifth and sixth transistors, and a third distance indicating the distance from the first transistor to each of the seventh and eighth transistors are the same distance.

(Supplementary Note 12)

In the semiconductor device described in Supplementary note 5, eleventh and twelfth transistors included in the plurality of second transistors are adjacent to a first region where the first transistor and the third to tenth transistors are in one region, and with the first transistor as center, are arranged symmetrically with respect to a fifth direction that is any one direction of the first to fourth directions.

(Supplementary Note 13)

In the semiconductor device described in Supplementary note 12, thirteenth and fourteenth transistors included in the plurality of second transistors are adjacent to the first region, and with the first transistor as center, are arranged symmetrically with respect to a sixth direction that is any one direction of the first to fourth directions and is different from the fifth direction.

(Supplementary Note 14)

In the semiconductor device described in Supplementary note 13, fifteenth and sixteenth transistors included in the plurality of second transistors are adjacent to the first region, and with the first transistor as center, are arranged symmetrically with respect to a seventh direction that is any one direction of the first to fourth directions and is different from the fifth and sixth directions.

(Supplementary Note 15)

In the semiconductor device described in Supplementary note 14, seventeenth and eighteenth transistors included in the plurality of second transistors are adjacent to the first region, and with the first transistor as center, are arranged symmetrically with respect to an eighth direction that is any one direction of the first to fourth directions and is different from the fifth, sixth, and seventh directions.

(Supplementary Note 16)

In the semiconductor device described in Supplementary note 15, nineteenth and twentieth transistors included in the plurality of second transistors are adjacent to the first region, and with the first transistor as center, are arranged symmetrically with respect to a ninth direction that is different from the fifth to eighth directions.

(Supplementary Note 17)

In the semiconductor device described in Supplementary note 16, twenty first and twenty second transistors included in the plurality of second transistors are adjacent to the first region, and with the first transistor as center, are arranged symmetrically with respect to a tenth direction that is different from the fifth to ninth directions.

(Supplementary Note 18)

In the semiconductor device described in Supplementary note 17, twenty third and twenty fourth transistors included in the plurality of second transistors are adjacent to the first region, and with the first transistor as center, are arranged symmetrically with respect to an eleventh direction that is different from the fifth to tenth directions.

(Supplementary Note 19)

In the semiconductor device described in Supplementary note 18, twenty fifth and twenty sixth transistors included in the plurality of second transistors are adjacent to the first region, and with the first transistor as center, are arranged symmetrically with respect to a twelfth direction that is different from the fifth to eleventh directions.

(Supplementary Note 20)

The semiconductor device described in any one of Appendices 1 to 19 forms the one second current source, by the plurality of second transistors.

(Supplementary Note 21)

The semiconductor device described in any one of Appendices 1 to 19 forms the plurality of second current sources, each being formed of a prescribed number of the second transistors.

(Supplementary Note 22)

In the semiconductor device described in Supplementary note 21, a third current source included in the plurality of second current sources is formed of the prescribed number of the second transistors arranged symmetrically with respect to a first direction, with the first transistor as a reference.

(Supplementary Note 23)

In the semiconductor device described in Supplementary note 22, a fourth current source included in the plurality of second current sources is formed of the prescribed number of the second transistors arranged symmetrically with respect to a second direction that is different from the first direction, with the first transistor as a reference.

(Supplementary Note 24)

In the semiconductor device described in Supplementary note 23, a fifth current source included in the plurality of second current sources is formed of the prescribed number of the second transistors arranged symmetrically with respect to a third direction that is different from the first and second directions, with the first transistor as a reference.

(Supplementary Note 25)

In the semiconductor device described in Supplementary note 24, a sixth current source included in the plurality of second current sources is formed of the prescribed number of the second transistors arranged symmetrically with respect to a fourth direction that is different from the first, second, and third directions, with the first transistor as a reference.

(Supplementary Note 26)

In the semiconductor device described in Supplementary note 24, the plurality of second current sources are formed of one current source formed of any two current sources among the third to fifth current sources, and one remaining current source among the third to fifth current sources.

(Supplementary Note 27)

In the semiconductor device described in Supplementary note 25, the plurality of second current sources are formed of one current source formed of any three current sources among the third to sixth current sources, and one remaining current source among the third to sixth current sources.

(Supplementary Note 28)

In the semiconductor device described in Supplementary note 25, the plurality of second current sources are formed of one current source formed of any two current sources among the third to sixth current sources, and any two remaining current sources among the third to sixth current sources.

(Supplementary Note 29)

The semiconductor device described in any one of Appendices 3 to 19 forms the plurality of second current sources, each being formed of a prescribed number of the second transistors, and the prescribed number of the second transistors, with the first transistor as a reference, are arranged in any quadrant among first to fourth quadrants respectively divided in the first direction and the second direction orthogonal to the first direction.

(Supplementary Note 30)

The semiconductor device described in Supplementary note 2 forms the plurality of second current sources, each being formed of a prescribed number of the second transistors, wherein a third current source included in the plurality of second current sources is the third transistor, and the fourth current source included in the plurality of second current sources is the fourth transistor.

(Supplementary Note 31)

The semiconductor device described in Supplementary note 3 forms the plurality of second current sources, each being formed of a prescribed number of the second transistors, wherein the third current source included in the plurality of second current sources is formed of the third and fifth transistors, and the fourth current source included in the plurality of second current sources is formed of the fourth and sixth transistors.

(Supplementary Note 32)

The semiconductor device described in Supplementary note 4 forms the plurality of second current sources, each being formed of a prescribed number of the second transistors, wherein the third current source included in the plurality of second current sources is formed of the third, fifth, and seventh transistors, and the fourth current source included in the plurality of second current sources is formed of the fourth, sixth, and eighth transistors.

(Supplementary Note 33)

The semiconductor device described in Supplementary note 5 forms the plurality of second current sources, each being formed of a prescribed number of the second transistors, wherein the third current source included in the plurality of second current sources is formed of the third, fifth, seventh, and ninth transistors, and the fourth current source included in the plurality of second current sources is formed of the fourth, sixth, eighth, and tenth transistors.

(Supplementary Note 34)

The semiconductor device described in Supplementary note 3 forms the plurality of second current sources, each being formed of a prescribed number of the second transistors, wherein the third current source included in the plurality of second current sources is formed of the third and fourth transistors, and the fourth current source included in the plurality of second current sources is formed of the fifth and sixth transistors.

(Supplementary Note 35)

The semiconductor device described in Supplementary note 4 forms the plurality of second current sources, each being formed of a prescribed number of the second transistors, wherein the third current source included in the plurality of second current sources is formed of the third and fourth transistors, the fourth current source included in the plurality of second current sources is formed of the fifth and sixth transistors, and the fifth current source included in the plurality of second current sources is formed of the seventh and eighth transistors.

(Supplementary Note 36)

The semiconductor device described in Supplementary note 4 forms the plurality of second current sources, each being formed of a prescribed number of the second transistors, wherein the third current source included in the plurality of second current sources is formed of the third, fourth, and seventh transistors, and the fourth current source included in the plurality of second current sources is formed of the fifth, sixth, and eighth transistors.

(Supplementary Note 37)

The semiconductor device described in Supplementary note 5 forms the plurality of second current sources, each being formed of a prescribed number of the second transistors, wherein the third current source included in the plurality of second current sources is formed of the third and fourth transistors, the fourth current source included in the plurality of second current sources is formed of the fifth and sixth transistors, the fifth current source included in the plurality of second current sources is formed of the seventh and eighth transistors, and the sixth current source included in the plurality of second current sources is formed of the ninth and tenth transistors.

(Supplementary Note 38)

The semiconductor device described in Supplementary note 5 forms the plurality of second current sources, each being formed of a prescribed number of the second transistors, wherein the third current source included in the plurality of second current sources is formed of the third to fifth transistors, the fourth current source included in the plurality of second current sources is formed of the sixth to eighth transistors, and the fifth current source included in the plurality of second current sources is formed of the ninth and tenth transistors.

(Supplementary Note 39)

In the semiconductor device described in Supplementary note 1, channel lengths of all of the first transistor and the plurality of second transistors are in the same direction.

(Supplementary Note 40)

In the semiconductor device described in Supplementary note 39, directions in which current flows in all of the first transistor and the plurality of second transistors are the same direction.

(Supplementary Note 41)

In the semiconductor device described in Supplementary note 1, a plurality of wires respectively connected to a prescribed terminal of the plurality of second transistors, from a first node, are arranged such that an electrical characteristic of the wires is made uniform among the wires.

(Supplementary Note 42)

In the semiconductor device described in Supplementary note 1, a plurality of first wires, included in a first interconnect layer, respectively connected to first signal terminals of the plurality of second transistors, a first connection point to which the plurality of first wires are connected in common, and a second wire connected to a second signal terminal of the first transistor, are provided, wherein the second wire is connected to the first connection point, and the plurality of first wires, from the first connection point to the first signal terminals that respectively correspond thereto, respectively have the same through hole layer/contact layer, and have the same number of respective through hole contacts.

(Supplementary Note 43)

In the semiconductor device described in Supplementary note 42, the second signal terminal is connected to the first connection point via a through hole layer/contact layer, and the second wire.

(Supplementary Note 44)

In the semiconductor device described in Supplementary note 42 or 43, a plurality of third wires, included in a second interconnect layer different from the first interconnect layer, respectively connected to third signal terminals of the plurality of second transistors, a second connection point to which the plurality of third wires are connected in common, and a fourth wire connected to a fourth terminal of the first transistor, are provided, wherein the fourth wire is connected to the second connection point, the plurality of third wires, from the second connection point to the third signal terminals that respectively correspond thereto, respectively have the same through hole layer/contact layer, and have the same number of respective through hole contacts.

(Supplementary Note 45)

In the semiconductor device described in Supplementary note 42, the first connection point of the first interconnect layer is arranged in a region in which the first transistor is arranged.

(Supplementary Note 46)

In the semiconductor device described in Supplementary note 44, the first connection point of the first interconnect layer and the second connection point of the second interconnect layer are respectively arranged in a region in which the first transistor is arranged.

(Supplementary Note 47)

In the semiconductor device described in Supplementary note 1, the first current source forms an input side of a current mirror circuit, the one second current source forms an output side of the current mirror circuit, a first signal terminal and a second signal terminal of the first transistor are connected, the first signal terminal of the first transistor and a plurality of first signal terminals of the plurality of second transistors are connected in common, a plurality of second signal terminals of the plurality of second transistors are connected in common, and a third signal terminal of the first transistor and a plurality of third signal terminals of the plurality of second transistors are connected in common.

(Supplementary Note 48)

In the semiconductor device described in Supplementary note 1, the first current source forms an input side of a current mirror circuit, the plurality of second current sources form output sides of a plurality of current mirror circuits respectively corresponding thereto, a first signal terminal and a second signal terminal of the first transistor are connected, the first signal terminal of the first transistor and a plurality of first signal terminals of the plurality of second transistors are connected in common, a plurality of second signal terminals among said plurality of second transistors respectively corresponding to the plurality of transistors arranged in the same direction, among the plurality of second transistors, respectively correspond to output sides of the plurality of current mirror circuits, and a third signal terminal of the first transistor and a plurality of third signal terminals of the plurality of second transistors are connected in common.

(Supplementary Note 49)

In the semiconductor device described in Supplementary note 1, the first current source forms an input side of a current mirror circuit, the plurality of second current sources form output sides of a plurality of current mirror circuits respectively corresponding thereto, a first signal terminal and a second signal terminal of the first transistor are connected, the first signal terminal of the first transistor and a plurality of first signal terminals of the plurality of second transistors are connected in common, a plurality of second signal terminals among said plurality of second transistors respectively corresponding to the plurality of transistors arranged in a first direction, being the same direction, among the plurality of second transistors, are connected in common, and correspond to one output side among the plurality of current mirror circuits, a plurality of second signal terminals among said plurality of second transistors respectively corresponding to the plurality of transistors arranged in a second direction different from the first direction, being in the same direction, among the plurality of second transistors, are connected in common and correspond to another output side among the plurality of current mirror circuits, and a third signal terminal of the first transistor and a plurality of third signal terminals of the plurality of second transistors are connected in common.

(Supplementary Note 50)

In the semiconductor device described in any one of Appendices 1 to 49, the first transistor and each transistor of the plurality of second transistors are formed of a unit cell of the same configuration.

(Supplementary Note 51)

A semiconductor device is provided with a first transistor forming a first current source, and a plurality of second transistors forming one second current source or a plurality of second current sources, generated from the first current source, wherein a plurality of transistors arranged in the same direction, being at least a part of the plurality of second transistors, are arranged at mutually equal distances, with the first transistor as center, within a first frame indicating a surrounding area of the first transistor with the first transistor as a reference, and the first and second transistors comprising the same current supply capability as each other.

(Supplementary Note 52)

In the semiconductor device described in Supplementary note 51, the first frame includes a first distance in a first direction indicating a direction of current flowed by the first transistor, and the first frame has a second distance in a second direction orthogonal to the first direction, the first distance is shorter than the second distance, and the shape of the first frame is rectangular, with a line segment in the second direction longer than a line segment in the first direction.

(Supplementary Note 53)

In the semiconductor device described in Supplementary note 51, the first frame includes a first distance in a first direction indicating a direction of current flowed by the first transistor, and the first frame has a second distance in a second direction orthogonal to the first direction, the first distance and the second distance are the same distance, and the first frame is substantial a true circle with the first transistor as an axis.

(Supplementary Note 54)

The semiconductor device described in Supplementary note 52 or 53, wherein at least a part of the plurality of second transistors includes the plurality of transistors arranged in the first direction inside the first frame, and the plurality of transistors arranged in the second direction inside the first frame.

(Supplementary Note 55)

The semiconductor device described in Supplementary note 54, wherein at least a part of the plurality of second transistors includes the plurality of transistors arranged in a third direction different from the first and second directions inside the first frame, and the plurality of transistors arranged in a fourth direction different from the first to the third directions inside the first frame.

(Supplementary Note 56)

The semiconductor device described in Supplementary note 55, wherein the remaining a part of the plurality of second transistors includes the plurality of transistors arranged in any one of the first to fourth directions with the first transistor as a reference and arranged in a area that is outside of the first frame and inside of a second frame, the second frame being on an outer side of the first frame.

(Supplementary Note 57)

The semiconductor device described in Supplementary note 56, wherein the remaining a part of the plurality of second transistors includes the plurality of transistors arranged in another of any of the first to fourth directions in the area.

(Supplementary Note 58)

The semiconductor device described in Supplementary note 57, wherein the remaining a part of the plurality of second transistors includes the plurality of transistors arranged in a fifth direction different from the first to fourth directions in the area.

(Supplementary Note 59)

The semiconductor device described in Supplementary note 55, wherein the remaining a part of the plurality of second transistors includes the plurality of transistors arranged in a fifth direction different from the first to fourth directions with the first transistor as a reference and arranged in a area that is outside of the first frame and inside of a second frame, the second frame being on an outer side of the first frame.

It should be noted that other objects, features and aspects of the present invention will become apparent in the entire disclosure and that modifications may be done without departing the gist and scope of the present invention as disclosed herein and claimed as appended herewith.

Also it should be noted that any combination or selection of the disclosed and/or claimed elements, matters and/or items may fall under the modifications aforementioned.

What is claimed is:

1. A semiconductor device including a current mirror circuit, the current mirror circuit comprising:
    a first MOS transistor including source and drain electrodes coupled between first and second nodes, and a gate electrode coupled to the first node, whereby the gate electrode of the first MOS transistor is directly coupled to one of the source and drain electrodes via the first node;
    a second MOS transistor including source and drain electrodes coupled between third and fourth nodes, and a gate electrode coupled to the first node; and
    a third MOS transistor including source and drain electrodes coupled between fifth and sixth nodes, and a gate electrode coupled to the first node,
    wherein the first MOS transistor is arranged between the second and third MOS transistor.

2. The semiconductor device as claimed in claim 1, wherein a distance between the first MOS transistor and the second MOS transistor is substantially same as a distance between the first MOS transistor and the third MOS transistor.

3. The semiconductor device as claimed in claim 2, wherein the second and third MOS transistors are arranged to be symmetrical with respect to a point where the first MOS transistor is provided.

4. The semiconductor device as claimed in claim 3, the current mirror further comprising:
    fourth and fifth MOS transistors each including a gate electrode coupled to the first node,
    wherein the fourth and fifth MOS transistors are arranged between the first MOS transistor.

5. The semiconductor device as claimed in claim 4,
    wherein the first to third MOS transistors are arranged on a first line, and
    wherein the fourth and fifth MOS transistors and the first MOS transistors are arranged on a second line different from the first line.

6. The semiconductor device as claimed in claim 5, wherein the fourth and fifth MOS transistors are arranged to be symmetrical with respect to the point where the first MOS transistor is provided.

7. The semiconductor device as claimed in claim 6, wherein the distance between the first MOS transistor and the second MOS transistor is substantially same as a distance between the first MOS transistor and the fourth MOS transistor.

8. The semiconductor device as claimed in claim 6, wherein the distance between the first MOS transistor and the second MOS transistor is different from a distance between the first MOS transistor and the fourth MOS transistor.

9. The semiconductor device as claimed in claim 1, wherein the gate electrode of each of the first to third MOS transistors extends in a same direction.

10. The semiconductor device as claimed in claim 1, wherein each of the first to third MOS transistors has substantially the same size.

* * * * *